(12) United States Patent
Baek et al.

(10) Patent No.: US 10,651,198 B2
(45) Date of Patent: May 12, 2020

(54) SEMICONDUCTOR DEVICES AND METHODS OF MANUFACTURING THE SAME

(71) Applicant: Samsung Electronics Co., Ltd., Suwon-si, Gyeonggi-do (KR)

(72) Inventors: Seok-cheon Baek, Hwaseong-si (KR); Boh-chang Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/371,444

(22) Filed: Apr. 1, 2019

(65) Prior Publication Data

US 2019/0312055 A1 Oct. 10, 2019

(30) Foreign Application Priority Data

Apr. 4, 2018 (KR) .................. 10-2018-0039337

(51) Int. Cl.

| | |
|---|---|
| *H01L 27/11582* | (2017.01) |
| *G11C 5/06* | (2006.01) |
| *G11C 5/02* | (2006.01) |
| *H01L 27/11556* | (2017.01) |

(52) U.S. Cl.
CPC .......... *H01L 27/11582* (2013.01); *G11C 5/02* (2013.01); *G11C 5/06* (2013.01); *H01L 27/11556* (2013.01)

(58) Field of Classification Search
CPC .............................................. H01L 27/11582
See application file for complete search history.

(56) References Cited

U.S. PATENT DOCUMENTS

| | | |
|---|---|---|
| 8,824,184 B2 | 9/2014 | Baek et al. |
| 8,878,278 B2 | 11/2014 | Alsmeier et al. |
| 9,515,080 B2 | 12/2016 | Takahashi et al. |
| 9,520,406 B2 | 12/2016 | Makala et al. |

(Continued)

FOREIGN PATENT DOCUMENTS

| | | |
|---|---|---|
| KR | 10-0510739 | 8/2005 |
| KR | 10-2013-0019644 A | 2/2013 |

(Continued)

*Primary Examiner* — Peniel M Gumedzoe
*Assistant Examiner* — Christopher A Johnson
(74) *Attorney, Agent, or Firm* — Harness, Dickey & Pierce, P.L.C.

(57) ABSTRACT

A semiconductor device includes lower gate electrodes on a substrate in a first direction substantially perpendicular to a top surface of the substrate, upper gate electrodes on the lower gate electrodes in the first direction, and channel structures extending through the lower and upper gate electrodes in the first direction. Each channel structure includes a lower channel structure, an upper channel structure, and a landing pad interconnecting the lower and upper channel structures. The first channel structure includes a first landing pad having a horizontal width substantially greater than that of the lower channel structure of the first channel structure at a first vertical level. The second channel structure located closest to the first channel structure includes a second landing pad having a horizontal width substantially greater than that of the lower channel structure of the second channel structure at a second vertical level lower than the first vertical level.

18 Claims, 27 Drawing Sheets

(56) References Cited

U.S. PATENT DOCUMENTS

| | | | |
|---|---|---|---|
| 9,698,153 B2 | 7/2017 | Liu et al. | |
| 2004/0266101 A1* | 12/2004 | Park | H01L 27/10855 |
| | | | 438/253 |
| 2009/0039407 A1 | 2/2009 | Vora | |
| 2013/0044531 A1* | 2/2013 | Baek | G11C 5/025 |
| | | | 365/72 |
| 2015/0144382 A1* | 5/2015 | Choi | C04B 37/006 |
| | | | 174/255 |
| 2016/0043100 A1 | 2/2016 | Lee et al. | |
| 2017/0373084 A1* | 12/2017 | Shim | H01L 27/11565 |

FOREIGN PATENT DOCUMENTS

| | | |
|---|---|---|
| KR | 10-2014-0138121 A | 12/2014 |
| KR | 10-2016-0018921 A | 2/2016 |

* cited by examiner

SEMICONDUCTOR DEVICES AND METHODS OF MANUFACTURING THE SAME

CROSS-REFERENCE TO RELATED APPLICATION

This application claims the benefit, under 35 U.S.C. § 119, of Korean Patent Application No. 10-2018-0039337, filed on Apr. 4, 2018, in the Korean Intellectual Property Office, the disclosure of which is incorporated herein in its entirety by reference.

BACKGROUND

The inventive concepts relate to semiconductor devices and methods of manufacturing the same, and more particularly, to semiconductor devices including a channel structure extending in a vertical direction and methods of manufacturing the same.

As the integration of memory devices increases, memory devices having a vertical transistor structure are being developed instead of memory devices having a conventional planar transistor structure. Memory devices having a vertical transistor structure may further include a channel structure that extends in a vertical direction from a substrate. However, as the integration of memory devices increases, processes for manufacturing said memory devices becomes increasingly difficult, and thus the electrical characteristics of the memory devices manufactured according to said processes may be increasingly deteriorated.

SUMMARY

The inventive concepts provides a semiconductor device having excellent electrical characteristics and a large integration.

According to some example embodiments, a semiconductor device may include a plurality of lower gate electrodes on a substrate in a first direction substantially perpendicular to a top surface of the substrate, a plurality of upper gate electrodes on the plurality of lower gate electrodes in the first direction, the plurality of upper gate electrodes spaced apart from one another in the first direction, and a plurality of channel structures. Each channel structure of the plurality of channel structures may extend through both the plurality of lower gate electrodes and the plurality of upper gate electrodes in the first direction. Each channel structure of the plurality of channel structures may include a lower channel structure penetrating through the plurality of lower gate electrodes, an upper channel structure penetrating through the plurality of upper gate electrodes, and a landing pad interconnecting the lower channel structure to the upper channel structure. A first channel structure of the plurality of channel structures includes a first landing pad having a horizontal width substantially greater than a horizontal width of a first lower channel structure of the first channel structure at a first vertical level. A second channel structure of the plurality of channel structures that is closest to the first channel structure of a remainder of the plurality of channel structures may include a second landing pad having a horizontal width substantially greater than the horizontal width of a second lower channel structure of the second channel structure at a second vertical level, the second vertical level lower than the first vertical level.

According to some example embodiments, a semiconductor device may include a plurality of lower gate electrodes on a substrate in a first direction substantially perpendicular to a top surface of the substrate, a plurality of upper gate electrodes on the plurality of lower gate electrodes in the first direction, the plurality of upper gate electrodes spaced apart from one another in the first direction, and a plurality of channel structures. Each channel structure of the plurality of channel structures may extend through both the plurality of lower gate electrodes and the plurality of upper gate electrodes in the first direction. Each channel structure of the plurality of channel structures may include a lower channel structure penetrating through the plurality of lower gate electrodes, an upper channel structure penetrating through the plurality of upper gate electrodes, and a landing pad interconnecting the lower channel structure to the upper channel structure. A first channel structure of the plurality of channel structures may include a first landing pad having a largest horizontal width of the first landing pad at a first vertical level. A second channel structure of the plurality of channel structures that is closest to the first channel structure may include a second landing pad having a largest horizontal width of the second landing pad at a second vertical level that is substantially lower than the first vertical level.

According to some example embodiments, a semiconductor device may include a plurality of lower gate electrodes on a substrate in a first direction substantially perpendicular to a top surface of the substrate, a plurality of upper gate electrodes on the plurality of lower gate electrodes in the first direction, the plurality of upper gate electrodes spaced apart from one another in the first direction, a first channel structure that extends in the first direction and includes a first lower channel structure penetrating through the lower gate electrodes, a first upper channel structure penetrating through the upper gate electrodes, and a first landing pad between the first lower channel structure and the first upper channel structure, and a second channel structure that extends in the first direction and is spaced apart from the first channel structure in a second direction parallel to the top surface of the substrate and includes a second lower channel structure penetrating through the lower gate electrodes, a second upper channel structure penetrating through the upper gate electrodes, and a second landing pad between the second lower channel structure and the second upper channel structure. A bottom surface of the first upper channel structure may contact the first landing pad at a first vertical level and a bottom surface of the second upper channel structure may contact the second landing pad at a second vertical level substantially lower than the first vertical level.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, example embodiments will be described in detail with reference to the accompanying drawings.

Figure 1:
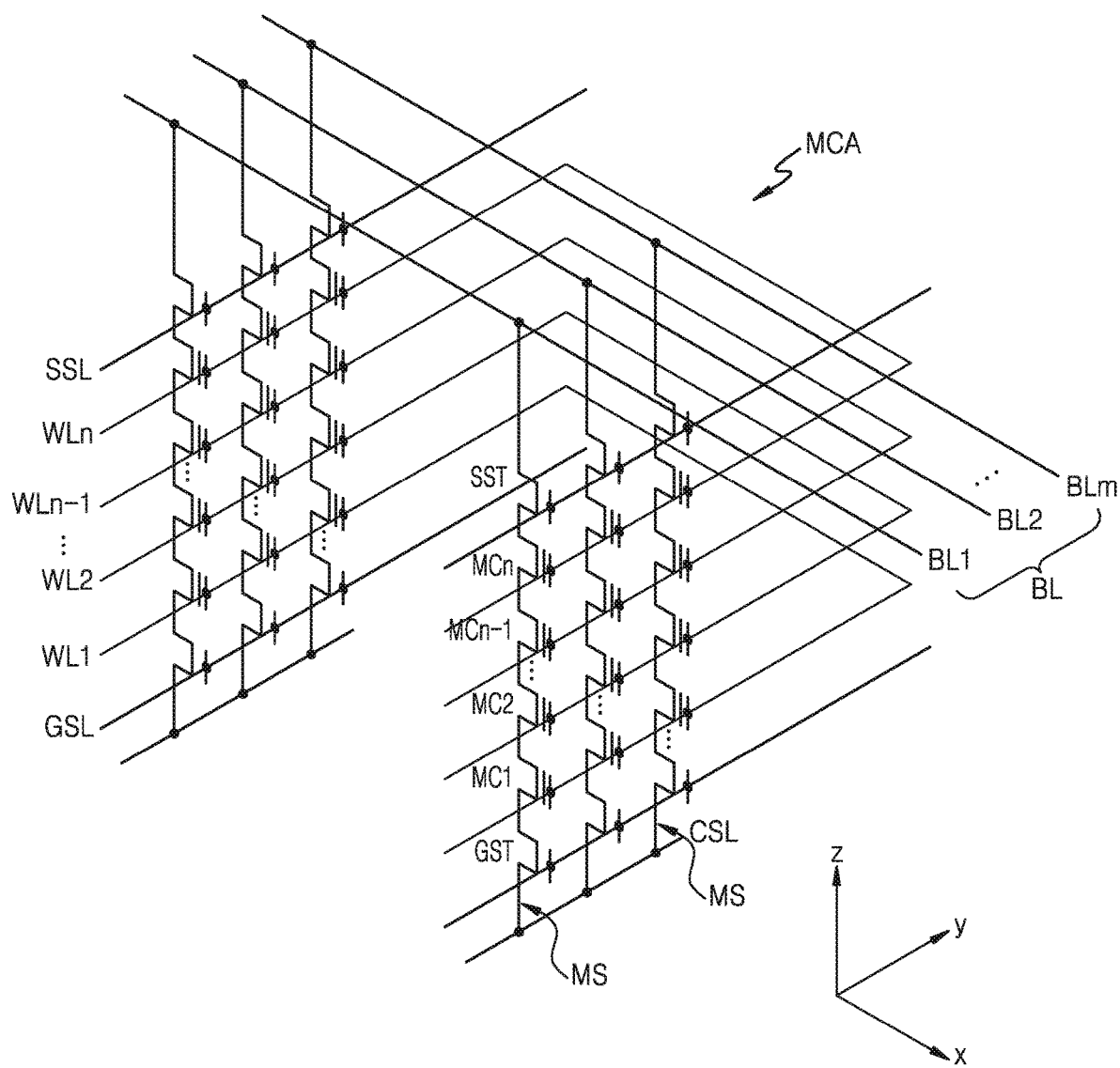
FIG. 1 is an equivalent circuit diagram of a memory cell array of a semiconductor device according to some example embodiments.

FIG. 1 is an equivalent circuit diagram of a memory cell array MCA of a semiconductor device according to some example embodiments, and more particularly, FIG. 1 is an equivalent circuit diagram of a vertical NAND flash memory device having a vertical channel structure.

Referring to FIG. 1, the memory cell array MCA may include a plurality of memory cell strings MS arranged in a vertical direction (Z direction in FIG. 1) on a substrate (not shown). Each of the memory cell strings MS may include a plurality of memory cells MC1, MC2, . . . , MCn−1, and MCn connected in series, a string select transistor SST, and a ground select transistor GST. The memory cells MC1, MC2, . . . , MCn−1, and MCn may store data, and a plurality of word lines WL1, WL2, . . . , WLn−1, and WLn may be connected to the memory cells MC1, MC2, . . . , MCn−1, and MCn and control the corresponding memory cells MC1, MC2, . . . , MCn−1, and MCn, respectively.

A gate terminal of the ground select transistor GST may be connected to a ground select line GSL and a source terminal of the ground select transistor GST may be connected to a common source line CSL. A gate terminal of the string select transistor SST may be connected to a string select line SSL, a source terminal of the string select transistor SST may be connected to a drain terminal of a memory cell MCn, and a drain terminal of the string select transistor SST may be connected to a corresponding bit line of a plurality of bit lines BL1, BL2, . . . , and BLm: BL. FIG. 1 shows an example in which each memory cell string MS includes one ground select transistor GST and one string select transistor SST. In some example embodiments, a plurality of ground select transistors GST and a plurality of string select transistors SST may be arranged in each memory cell string MS.

When a signal is applied to the gate terminal of the string select transistor SST through the string select line SSL, a signal applied through the bit lines BL may be provided to the memory cells MC1, MC2, . . . , MCn−1, and MCn, and thus a data write operation may be performed. When a signal is applied to the gate terminal of the ground select transistor GST through the ground select line GSL, an operation for erasing the memory cells MC1, MC2, . . . , MCn−1, and MCn may be performed.

Figure 2:
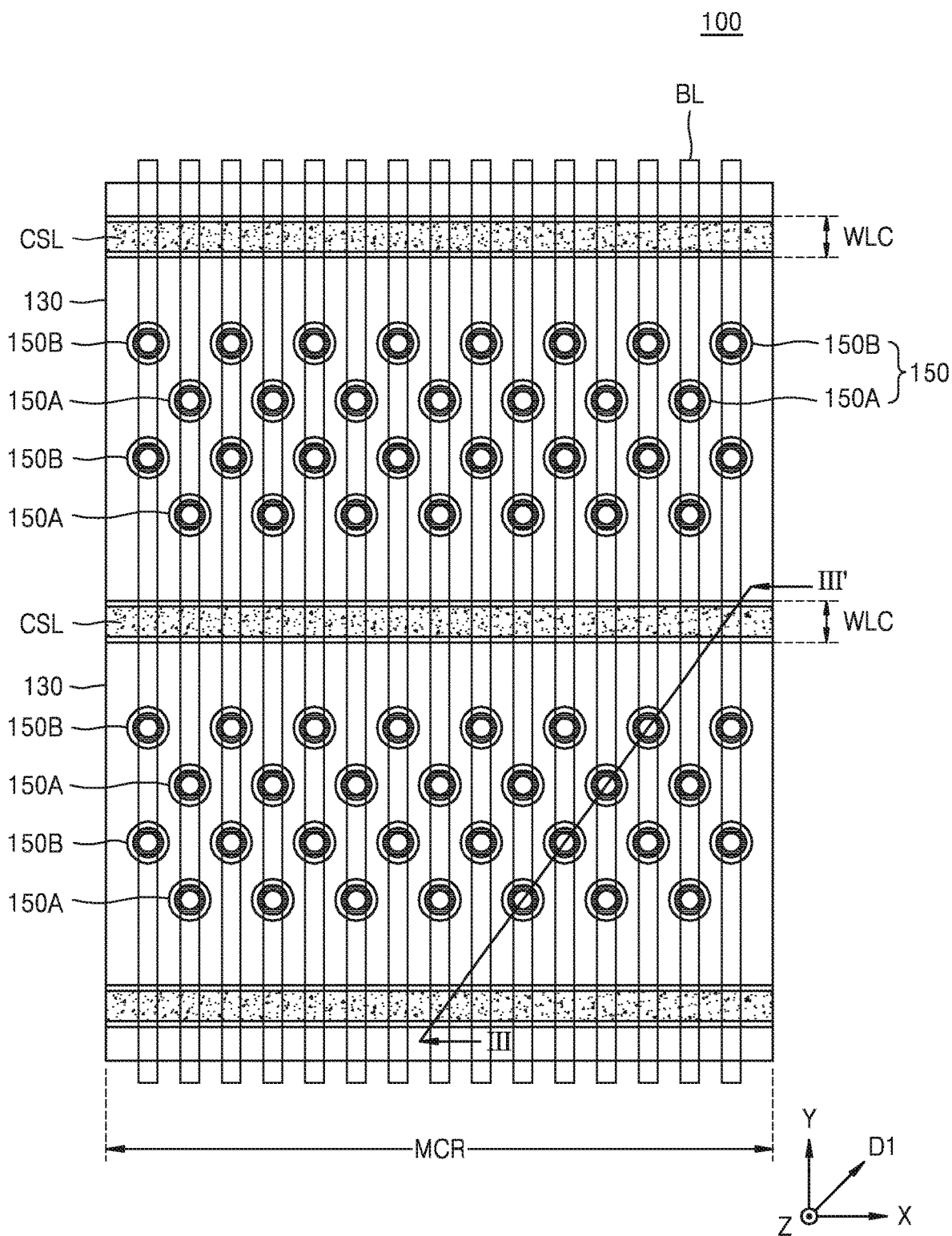
FIG. 2 is a plan view of representative components of the semiconductor device according to some example embodiments.
Figure 3:
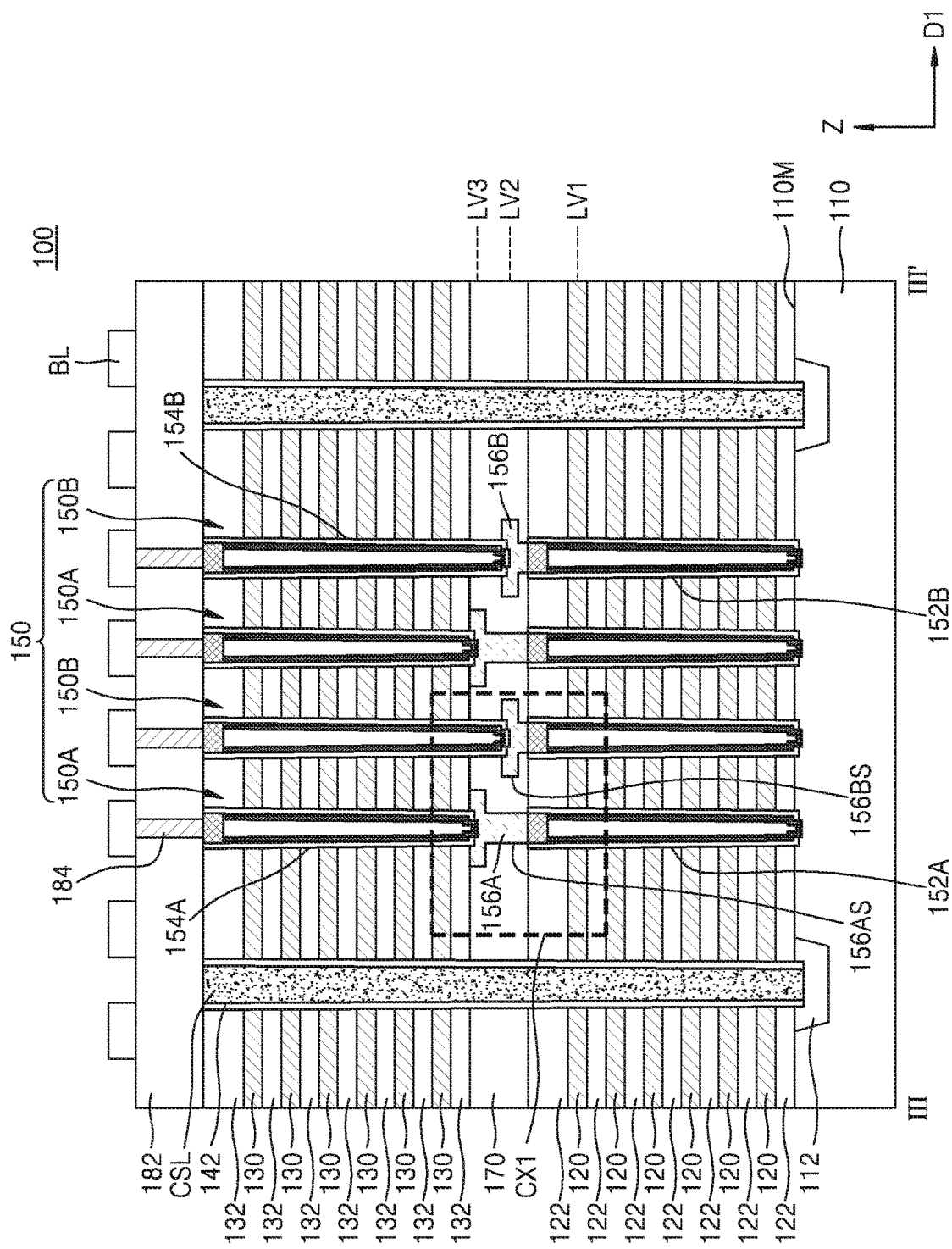
FIG. 3 is cross-sectional view taken along a line III-III' in FIG. 2.
Figure 4:
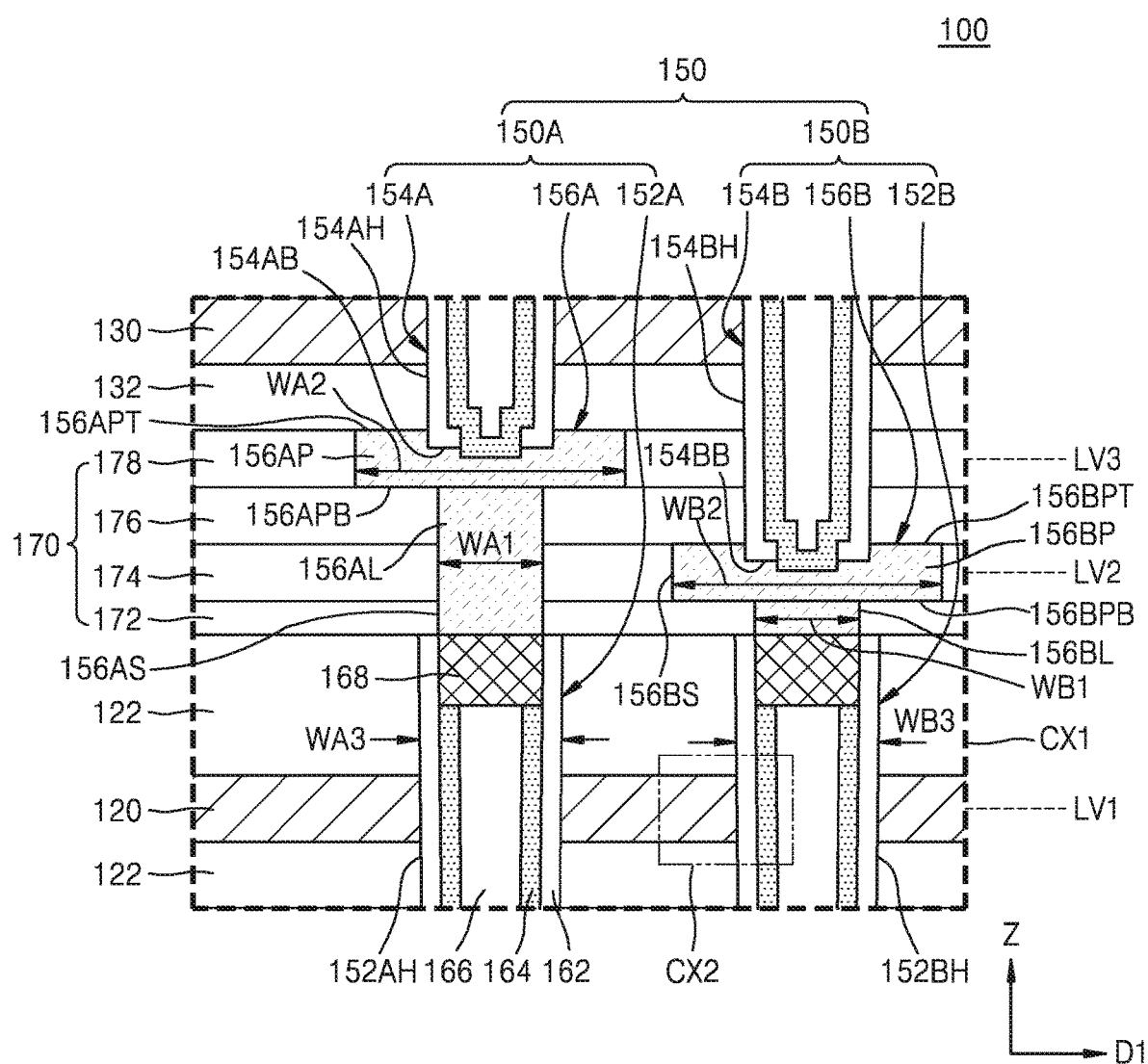
FIG. 4 is a magnified cross-sectional view of a portion CX1 in FIG. 3.
Figure 5A:
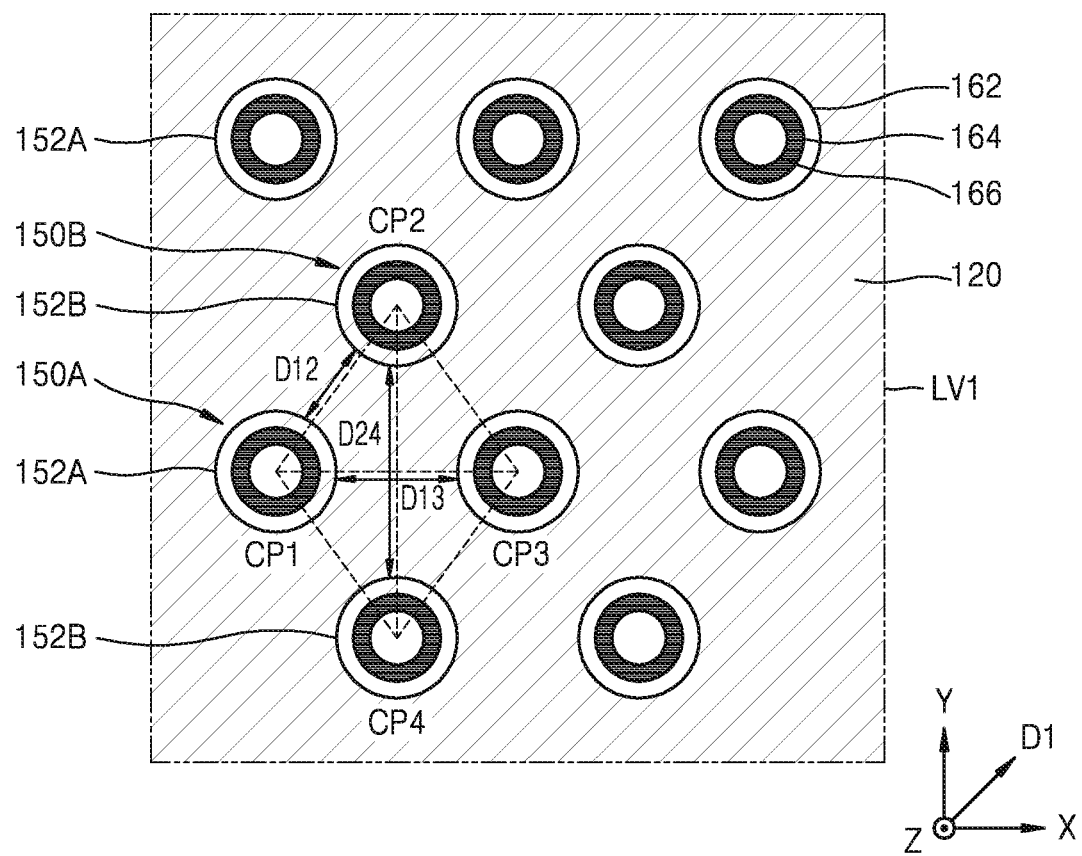
FIG. 5A is a horizontal sectional view at a first level of FIG. 3.
Figure 5B:
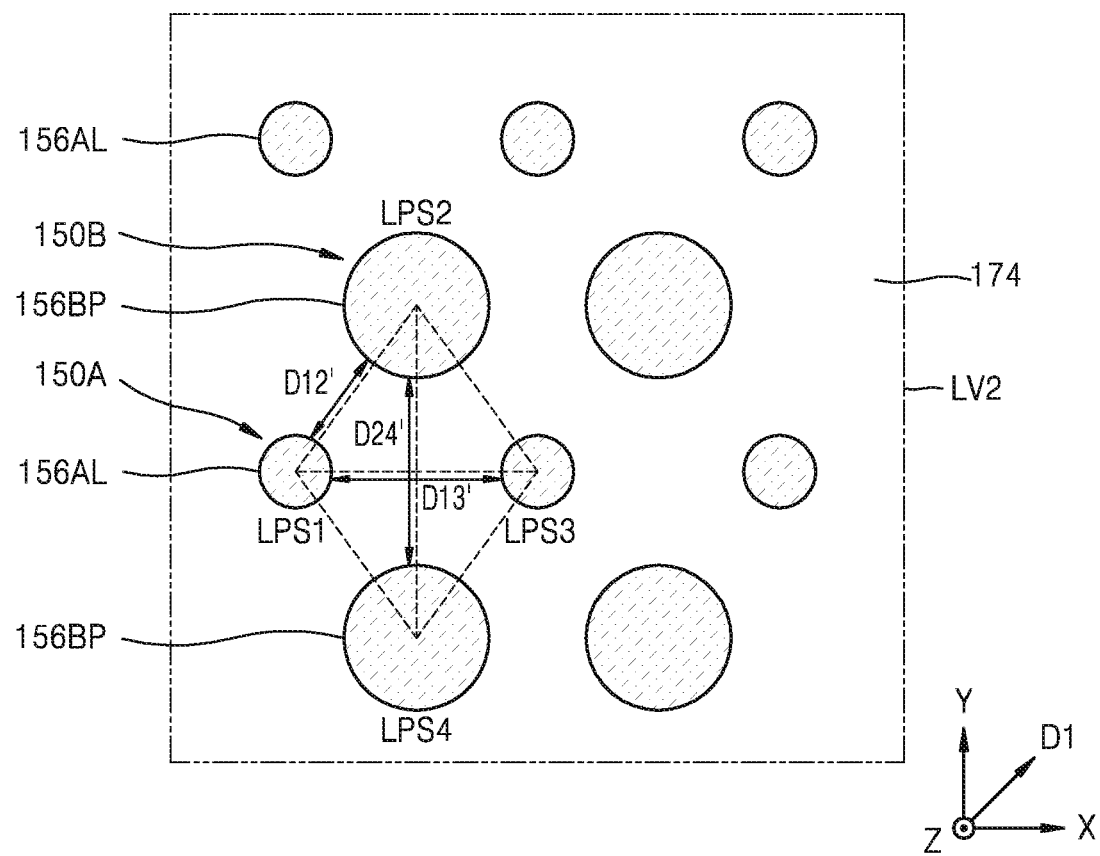
FIG. 5B is a horizontal sectional view at a second level of FIG. 3.
Figure 5C:
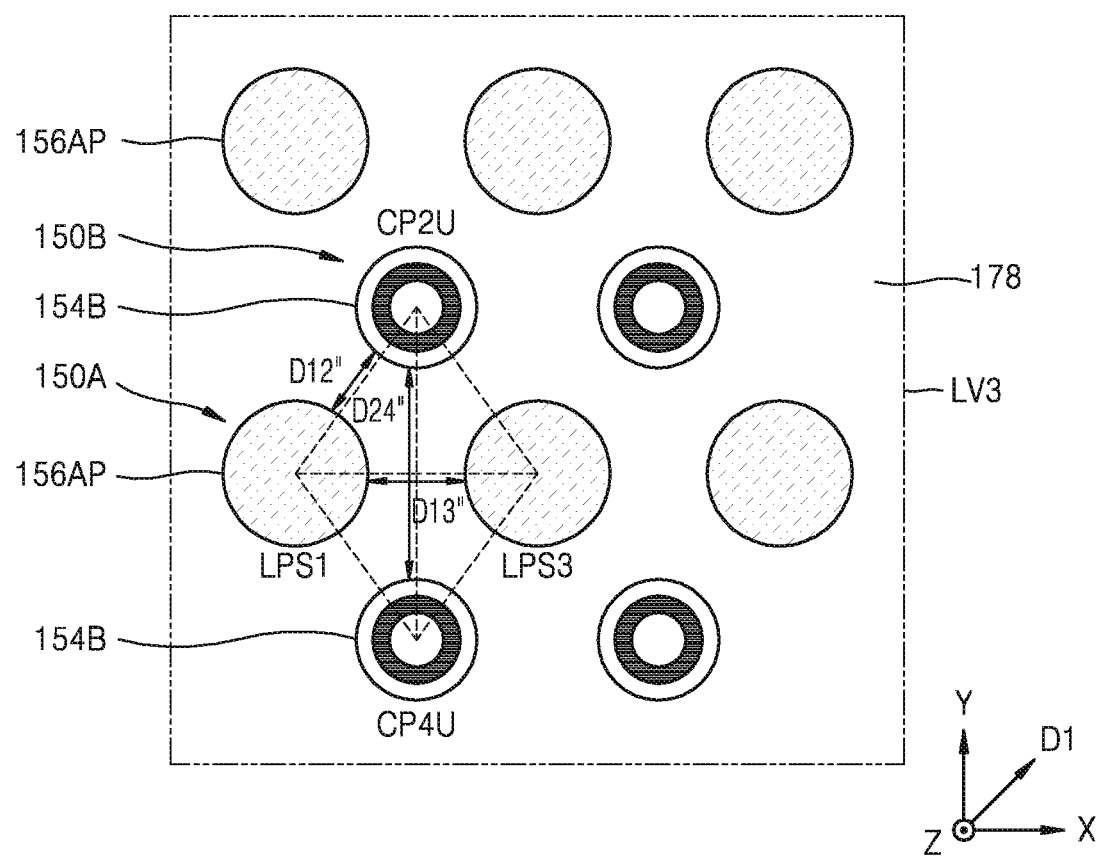
FIG. 5C is a horizontal sectional view at a third level of FIG. 3.

FIGS. 2 to 4 and FIGS. 5A to 5C are diagrams for describing a semiconductor device 100 according to some example embodiments. FIG. 2 is a plan view of representative components of the semiconductor device 100 according to some example embodiments, FIG. 3 is cross-sectional view taken along a line III-III' in FIG. 2, and FIG. 4 is a magnified cross-sectional view of a portion CX1 in FIG. 3. FIG. 5A is a horizontal sectional view at a first level LV1 of FIG. 3, FIG. 5B is a horizontal sectional view at a second level LV2 of FIG. 3, and FIG. 5C is a horizontal sectional view at a third level LV3 of FIG. 3.

Referring to FIGS. 2 to 5C, the semiconductor device 100 may include a memory cell array MCA disposed on a memory cell region MCR of a substrate 110. The memory cell array MCA may be a NAND memory device having a vertical channel structure, which operates in a manner as described above with reference to FIG. 1.

The substrate 110 may have a main surface 110M extending in a first horizontal direction (X direction) and a second horizontal direction (Y direction). The substrate 110 may include a semiconductor material, e.g., a Group IV semiconductor, a Group III-V compound semiconductor, or a Group II-VI oxide semiconductor. For example, the Group IV semiconductor may include silicon (Si), germanium (Ge), or silicon-germanium. The substrate 110 may be provided as a bulk wafer or an epitaxial layer. According to some example embodiments, the substrate 110 may include a silicon-on-insulator (SOI) substrate or a germanium-on-insulator (GeOI) substrate.

A plurality of lower gate electrodes 120 may be disposed on the substrate 110 to extend in the first horizontal direction (X direction) and the second horizontal direction (Y direction) that is parallel or substantially parallel (e.g., parallel within manufacturing tolerances and/or material tolerances) to the main surface 110M of the substrate 110 and be spaced apart from (e.g., isolated from direct contact with, "offset from," or the like) one another in a vertical direction (Z direction, also referred to herein as a first direction) that is perpendicular or substantially perpendicular (e.g., perpendicular within manufacturing tolerances and/or material tolerances) to the main surface 110M of the substrate 110 (also referred to herein as a "top surface" of the substrate 110). As further shown in at least FIG. 3, the plurality of lower gate electrodes 120 are on the substrate in the vertical direction. A plurality of upper gate electrodes 130 may be disposed on the lower gate electrodes 120 to each extend in first and second horizontal directions parallel or substantially parallel to the main surface 110M of the substrate 110 and to be spaced apart from (e.g., isolated from direct contact with) one another in a vertical direction perpendicular or substantially perpendicular to the main surface 110M of the substrate 110. Accordingly, the lower gate electrodes 120 and the upper gate electrodes 130 may be arranged ("structurally configured") to overlap each other in a vertical direction in the memory cell region MCR.

It will be understood herein that an element that is "on" another element may be "above" or "beneath" the other element. In addition, an element that is "on" another element may be "directly on" the other element (e.g., in direct contact with the other element) or may be "indirectly on" the other element (e.g., isolated from direct contact with the other element by at least one interposing element and/or space).

In example embodiments, the lower gate electrodes 120 and the upper gate electrodes 130 may together correspond to the ground select line GSL, the word lines WL1, WL2, . . . , WLn−1, and WLn, and the string select line SSL constituting the memory cell string MS (refer to FIG. 1). For example, for convenience of explanation, FIG. 2 shows that six lower gate electrodes 120 and six upper gate electrodes 130 are stacked in the vertical direction (Z direction). In this case, the lowermost lower gate electrodes 120 may function as the ground select line GSL, the uppermost upper gate electrodes 130 may function as the string select line SSL, and the lower gate electrodes 120 other than lowermost lower gate electrodes 120 and the upper gate electrodes 130 other than the uppermost upper gate electrodes 130 may function as the word lines WL1, WL2, . . . , WLn−1, and WLn. Accordingly, the memory cell string MS in which the ground select transistor GST, the selection transistor SST, and a total of ten memory cell transistors MCn connected in series may be provided.

A lower insulating layer 122 may be between two of the lower gate electrodes 120 adjacent to each other. Also, the lower insulating layer 122 may also be between the main surface 110M of the substrate 110 and the lowermost lower gate electrodes 120. The lower insulating layer 122 may also be on the uppermost lower gate electrodes 120. As shown in FIG. 3, the thickness of the lower insulating layer 122 may vary depending on the vertical position of the lower insulating layer 122. For example, unlike as shown in FIG. 3, the lower insulating layers 122 between the substrate 110 and the lowermost lower gate electrodes 120 may have a thickness in the vertical direction (Z direction) that is less than that of the lower insulating layer 122 on the uppermost lower gate electrode 120.

An upper insulating layer 132 may be between two of the upper gate electrodes 130 adjacent to each other. Also, the upper insulating layer 132 may be between the lowermost upper gate electrodes 130 and a first interlayer insulating film 170. The upper insulating layer 132 may also be on the uppermost upper gate electrodes 130.

The first interlayer insulating film 170 may be between the uppermost lower insulating layer 122 and the lowermost upper insulating layer 132 and include sequentially stacked first to fourth insulating layers 172, 174, 176, and 178. However, the inventive concepts is not limited thereto. As shown in at least FIG. 3 and FIG. 4, the first interlayer insulating film 170 may be between the plurality of lower gate electrodes 120 and the plurality of upper gate electrodes 130. As further shown in at least FIG. 3 and FIG. 4, a side surface 156AS of the first landing pad 156A and a side surface 156BS of the second landing pad 156B are surrounded by the first interlayer insulating film 170.

A plurality of word line cut regions WLC may extend on the substrate 110 in the first horizontal direction (X direction) parallel to the main surface 110M of the substrate 110. The word line cut regions WLC may define widths of the lower gate electrodes 120 and the upper gate electrodes 130 in the second horizontal direction (Y direction). In other words, the lower gate electrodes 120 and the upper gate electrodes 130 may be arranged to have substantially same widths in the second horizontal direction (Y direction) due to the word line cut regions WLC. Also, the word line cut regions WLC may be between the lower gate electrodes 120 and the lower gate electrodes 120 adjacent thereto and between the upper gate electrodes 130 and the upper gate electrodes 130 adjacent thereto.

A plurality of common source regions 112 may be in the substrate 110 in the first horizontal direction (X direction). The common source regions 112 may be impurity regions heavily doped with an n-type impurity. The common source regions 112 may function as source regions for supplying currents to the memory cells MC1, MC2, . . . , MCn−1, and MCn. The common source regions 112 may be at locations overlapping the word line cut regions WLC.

The common source line CSL may be on the common source regions 112. Insulation spacers 142 may be on both sidewalls of the common source line CSL. The insulation spacers 142 may be between the common source line CSL and the lower gate electrodes 120 and between the common source line CSL and the upper gate electrodes 130. The common source line CSL and the insulation spacers 142 may extend to a level lower than the main surface 110M of the substrate 110 and may contact the common source regions 112.

As shown in FIG. 3, the common source line CSL is at one side of the lower gate electrodes 120 and the upper gate electrodes 130, and a top surface of the common source line CSL may be at a higher level than a top surface of the uppermost upper gate electrodes 130. However, the inventive concepts is not limited thereto, and the height of the common source line CSL may be suitably selected, such that the top surface of the common source line CSL is at a level lower than a bottom surface of the lowermost upper gate electrodes 130 or at an arbitrary level lower than the top surface of the uppermost upper gate electrodes 130.

A plurality of channel structures 150 may each extend from the main surface 110M of the substrate 110 in the vertical direction (Z direction) through both the plurality of lower gate electrodes 120 and the plurality of upper gate electrodes 130. The channel structures 150 may be arranged ("configured") such that the channel structures 150 are spaced apart from one another at a certain ("particular") interval in the first horizontal direction (X direction), the second horizontal direction (Y direction), and a third horizontal direction or a diagonal direction (D1 direction). As referred to herein, it will be understood that the first through third horizontal directions (e.g., X direction and Y direction) and the diagonal direction (D1 direction) are parallel or substantially parallel (e.g., parallel within manufacturing tolerances and/or material tolerances) to a top surface (e.g., main surface 110M) of the substrate 110. As shown in FIG. 2, the channel structures 150 may be arranged in a zigzag form or a staggered form.

As shown in at least FIG. 2, the plurality of channel structures 150 may include a plurality of first channel structures 150A arranged in a line in the first horizontal direction (X direction) at one side of the word line cut region WLC and a plurality of second channel structures 150B, which are respectively spaced apart from the first channel structures 150A in a diagonal direction (D1 direction) and arranged in a line in the first horizontal direction (X direction).

Each first channel structure of the first channel structures 150A may include a first lower channel structure 152A, a first upper channel structure 154A, and a first landing pad 156A. The first lower channel structure 152A and the first upper channel structure 154A may be connected to each other via the first landing pad 156A therebetween, where the first lower channel structure 152A may at least partially comprise the lower half of the memory cell string MS (refer to FIG. 1) and the first upper channel structure 154A may at least partially comprise the upper half of the memory cell string MS.

The first lower channel structure 152A may extend in the vertical direction (Z direction) through the lower gate electrodes 120 from the main surface 110M of the substrate 110. The first upper channel structure 154A may extend in the vertical direction (Z direction) through the upper gate electrodes 130. Restated, each first channel structure 150A may include a first lower channel structure 152A penetrating through the plurality of lower gate electrodes 120, a first upper channel structure 154A penetrating through the plurality of upper gate electrodes 130, and a first landing pad 156A interconnecting the first lower channel structure 152A to the first upper channel structure 154A.

As shown in FIG. 4, the first lower channel structure 152A may be in a first lower channel hole 152AH that penetrates through the lower gate electrodes 120. A gate insulating layer 162 and a channel layer 164 may be sequentially disposed on an inner wall of the first lower channel hole 152AH and a buried insulating layer 166 may be disposed on the channel layer 164 to fill the remaining space of the first lower channel hole 152AH. A conductive plug 168 that contacts the channel layer 164 and covers the inlet of the first lower channel hole 152AH may be in an upper portion of the first lower channel hole 152AH. In other embodiments, the buried insulating layer 166 may be omitted and the channel layer 164 may have a pillar shape to fill the remaining space of the first lower channel hole 152AH.

The first upper channel structure 154A may be in a first upper channel hole 154AH penetrating through the upper gate electrodes 130. The first upper channel structure 154A may have a structure similar to that of the first lower channel structure 152A. In other words, the first upper channel structure 154A may include the gate insulating layer 162, the channel layer 164, the buried insulating layer 166, and the conductive plug 168.

The first landing pad 156A may be between the first lower channel structure 152A and the first upper channel structure 154A and may electrically interconnect the first lower channel structure 152A to the first upper channel structure 154A. The first landing pad 156A may include a first lower connection 156AL and a first pad 156AP. The first lower connection 156AL may be on the first lower channel structure 152A and may have a first width ("horizontal width") WA1 in a third horizontal direction (D1 direction). The first pad 156AP may be on the first lower connection 156AL, may contact the bottom surface 154AB of the first upper channel structure 154A, and may have a second width WA2 that is substantially greater than the first width WA1 in the third horizontal direction (D1 direction) (e.g., horizontal width WA2 may be equal to or greater than 110% of horizontal width WA1). Accordingly, the first landing pad 156A may have a T-shaped vertical cross-sectional shape of which the width of its upper portion is substantially greater than (e.g., equal to or greater than 110% of) the width of its lower portion. Meanwhile, each of the first lower connection 156AL and the first pad 156AP may have a horizontal cross-section having various shapes like a circle, an ellipse, a rectangle, a square, a rhombus, a rounded rectangle, a rounded square, etc. The first lower connection 156AL and the first pad 156AP may include polysilicon doped with an impurity, undoped polysilicon, a metal or a metal silicide. As shown in FIG. 4, the first upper channel structure 154A may vertically overlap with the first pad 156AP and the first upper channel structure 154A may vertically overlap with at least a portion of the first lower channel structure 152A.

As described herein, a dimension that is "substantially less than" another dimension will be understood to be less than the other dimension by a proportion of at least 10% of the magnitude of the other dimension. Restated, a dimension that is "substantially less than" the other dimension will be understood to be equal to or less than 90% of the other dimension.

As further described herein, dimension that is "substantially greater than" another dimension will be understood to be greater than the other dimension by a proportion of at least 10% of the magnitude of the other dimension. Restated, a dimension that is "substantially greater than" the other dimension will be understood to be equal to or greater than 110% of the other dimension.

In example embodiments, a bottom surface of the first upper channel structure 154A may be on the first pad 156AP. The first upper channel structure 154A may extend to a level lower than that of the top surface of the first pad 156AP to further increase the contact area between the first pad 156AP and the first upper channel structure 154A.

As shown in FIG. 4, the first pad 156AP may have the second width WA2 that is substantially greater than (e.g., equal to or greater than 110% of) a third width WA3 of the first lower channel structure 152A in the third horizontal direction (the direction D1). Restated, the first landing pad 156A may have a horizontal width (second width WA2) that is substantially greater (e.g., equal to or greater than 110% of) a horizontal width of the first lower channel structure 152A (e.g., WA3) at a first vertical level (e.g., LV3). In this case, even when the substrate 110 is bent or warped or a mask pattern (not shown) is misaligned during a process for etching the first upper channel hole 154AH for the first upper channel structure 154A, a sufficient electrical connection may be secured by the first pad 156AP between the first upper channel structure 154A and the first lower channel structure 152A.

The second channel structures 150B may be closest to the first channel structures 150A, respectively. Restated, a second channel structure 150B may be the closest channel structure, of the plurality of channel structures 150, in relation to a particular first channel structure 150A. Each of the second channel structures 150B may include a second lower channel structure 152B, a second upper channel structure 154B, and a second landing pad 156B. The second lower channel structure 152B and the second upper channel structure 154B may have structures similar to those of the first lower channel structure 152A and the first upper channel structure 154A. In other words, the second lower channel structure 152B and the second upper channel structure 154B may include a gate insulating layer 162, a channel layer 164, a buried insulating layer 166, and a conductive plug 168 that are formed in the second lower channel hole 152BH and the second upper channel hole 154BH. Restated, each second channel structure 150B may include a second lower channel structure 152B penetrating through the plurality of lower gate electrodes 120, a second upper channel structure 154B penetrating through the plurality of upper gate electrodes 130, and a second landing pad 156B interconnecting the second lower channel structure 152B to the second upper channel structure 154B.

The second landing pad 156B may include a second lower connection 156BL and a second pad 156BP. The second lower connection 156BL is on the second lower channel structure 152B and may have a first width WB1 in the third horizontal direction (D1 direction). The second pad 156BP may be on the second lower connection 156BL, may contact the bottom surface 154BB of the second upper channel structure 154B, and may have a second width WB2 that is substantially greater than the first width WB1 (e.g., equal to or greater than 110% of the first width WB1) in the third horizontal direction (D1 direction). Accordingly, the second landing pad 156B may have a T-shaped vertical cross-sectional shape having an upper width substantially greater than a lower width thereof.

As shown in FIG. 4, a top surface 156BPT of the second pad 156BP may be at a level substantially lower than a level of the bottom surface 156APB of the first pad 156AP, such that the bottom surface 156APB of the first pad 156AP is at a level substantially higher than a level of the top surface 156BPT of the second pad 156BP. As referred to herein, a level that is substantially higher than another level may be equal to or greater than 110% of the distance of the other level from the substrate 110, and a level that is substantially lower than another level may be equal to or less than 90% of the distance of the other level from the substrate 110. For example, the first pad 156AP may be at a first vertical level (e.g., LV3 in FIG. 4) and the second pad 156BP may be at a second vertical level (e.g., LV2 in FIG. 4). A bottom surface 156BPB of the second pad 156BP may be at a level lower than that of the top surface 156APT of the first pad 156AP, and thus the second pad 156BP and the first pad 156AP may be spaced apart from (e.g., isolated from direct contact with) each other in the vertical direction (Z direction). As the second pad 156BP is at a vertical level lower than that of the first pad 156AP, even when the interval between the first channel structure 150A and the second channel structure 150B is relatively small, the first pad 156AP and the second pad 156BP may have relatively large widths, and thus a sufficient process margin may be ensured in a process for forming the first and second upper channel holes 154AH and 154BH. Restated, as shown in at least FIG. 4, the second landing pad 156B may have a horizontal width (width WB2) that is substantially greater than (e.g., equal to or greater than 110% of) a horizontal width of the second lower channel structure 152B (e.g., WB3) at a second vertical level (e.g., LV2) that is lower than the above-described first vertical level at which the first landing pad 156A has the horizontal width (width WA2) that is substantially greater than a horizontal width (e.g., WA3) of the first lower channel structure 152A (e.g., LV3). As shown in FIG. 4, levels LV1 and LV2 are understood to be levels that are "lower" than level LV3, and level LV1 is understood to be a level that is "lower" than levels LV2 and LV3.

As further shown in FIG. 4, a bottom surface 154AB of the first upper channel structure 154A of the first channel structure 150A may contact the first pad 156AP, a bottom surface 154BB of the second upper channel structure 154B of the second channel structure 150B may contact the second pad 156BP, and the bottom surface 154BB of the second upper channel structure 154B of the second channel structure 150B is located at a level substantially lower than a level of the bottom surface 154AB of the first upper channel structure 154A of the first channel structure 150A.

In some example embodiments, widths WA2 and WB2 may be equal or substantially equal (e.g., equal within manufacturing tolerances and/or material tolerances). In some example embodiments, the first channel structure 150A includes a first landing pad 156A having a largest horizontal width of the first landing pad (e.g., WA2) at a first vertical level (e.g., LV3), and a second channel structure 150B that is closest to the first channel structure 150A may include a second landing pad 156B having a largest horizontal width of the second landing pad (e.g., WB2) at a second vertical level (e.g., LV2) that is substantially lower than the first vertical level (e.g., LV3). As shown, for example, at FIG. 4, the first pad 156AP is at the first vertical level (e.g., LV3), and the second pad 156BP is at the second vertical level (e.g., LV2).

Hereinafter, the arrangement of the first landing pad 156A and the second landing pad 156B at the first level to the third level LV1, LV2, and LV3 will be briefly described with reference to FIGS. 5A to 5C.

Referring to the plan views of FIGS. 5A to 5C, the first channel structures 150A and the second channel structures 150B may be arranged in a zigzag form. Here, at the first level LV1, the first lower channel structure 152A and the second lower channel structure 152B are arranged. The positions of four channel structures 150 arranged in a rhombus shape around one first lower channel structure 152A are shown as first to fourth channel positions CP1, CP2, CP3, and CP4, respectively. Here, the first lower channel structure 152A is at the first and third channel positions CP1 and CP3 and the second lower channel structure 152B is at the second and fourth channel positions CP2 and CP4.

As shown in FIG. 5A, first and second distances D12 and D13 from the first channel position CP1 to the second and third channel positions CP2 and CP3 and a third distance D24 between the second channel position CP2 and the fourth channel position CP4 may be different from one another. According to some example embodiments, the first distance D12 may be the shortest. In other words, the first channel structure 150A and the second channel structure 150B are arranged closest to each other in the diagonal direction (D1 direction).

As shown in FIG. 5B, the first lower connection 156AL of the first channel structure 150A and the second pad 156BP of the second channel structure 150B may be at the second level LV2. Since the width of the second pad 156BP is relatively large and the width of the first lower connection 156AL is relatively small, first and second distances D12' and D13' from a first landing pad position LPS1 to the second and third landing pad positions LPS2 and LPS3 and a third distance D24' between the second and fourth landing pad positions LPS2 and LPS4 may be different from the first to third distances D12, D13, and D24 at the first level LV1, respectively. However, since the width (or diameter) of the second pad 156BP is relatively large and the width (or diameter) of the first lower connection 156AL is relatively small, a difference between the first distance D12 at the first level LV1 and the first distance D12' at the second level LV2 may be relatively small.

As shown in FIG. 5C, the first landing pad 156A of the first channel structure 150A and the second upper channel structure 154B of the second channel structure 150B may be at the third level LV3. At the third level LV3, first and third landing pad positions LPS1 and LPS3 and second and fourth channel positions CP2U and CP4U are shown. A distance D12" between the first landing pad position LPS1 and a second channel position CP2U may be relatively small as compared to the first distance D12 at the first level LV1 or the first distance D12' at the second level LV2.

As shown in FIGS. 5A to 5C, because the first pad 156AP of the first landing pad 156A is at a level substantially higher than that of the second pad 156BP of the second landing pad 156B, and the first pad 156AP of the first landing pad 156A is vertically apart from the second pad 156BP of the second landing pad 156B, defects due to misalignment during formation of first and second upper channel holes 154AH and 154BH may be prevented.

FIGS. 2 to 5C show that the first channel structure 150A has the largest width at a first vertical level (e.g., LV3 in FIG. 4) and the second channel structure 150B has the largest width at a second vertical level (e.g., LV2 in FIG. 4). However, the inventive concepts is not limited thereto, and a third channel structure that is adjacent to the first and second channel structures 150A and 150B and has the largest width at a third vertical level different from the first and second vertical levels may be further provided.

FIGS. 6A through 6D are cross-sectional views of various configurations of the gate insulating layer 162 included in the semiconductor device 100 according to some example embodiments.

Figure 6A:
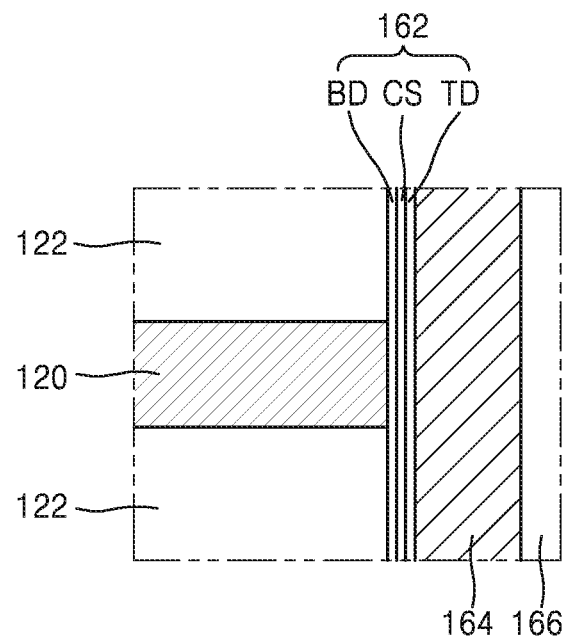
FIGS. 6A, 6B, 6C, and 6D are cross-sectional views of various configurations of a gate insulating layer included in a semiconductor device according to some example embodiments.

FIG. 6A is a cross-sectional view of the gate insulating layer 162 shown in FIGS. 2 to 5C in more detail and is an enlarged view of a region denoted by "CX2" in FIG. 4.

Referring to FIG. 6A, the gate insulating layer 162 may include a tunneling dielectric film TD, a charge storage film CS, and a blocking dielectric film BD sequentially formed on the channel layer 164. The relative thicknesses of the tunneling dielectric film TD, the charge storage film CS, and the blocking dielectric film BD constituting the gate insulating layer 162 are not limited to those shown in FIG. 6A, and various modifications may be made therein.

The tunneling dielectric film TD may include silicon oxide, hafnium oxide, aluminum oxide, zirconium oxide, tantalum oxide, etc. The charge storage film CS is a region in which electrons that passed through the tunneling dielectric film TD from the channel layer 164 may be stored and may include silicon nitride, boron nitride, silicon boron nitride, or poly-silicon doped with an impurity. The blocking dielectric film BD may include silicon oxide, silicon nitride, or a metal oxide having a higher dielectric constant than silicon oxide. The metal oxide may be hafnium oxide, aluminum oxide, zirconium oxide, tantalum oxide, or a combination thereof.

Figure 6B:
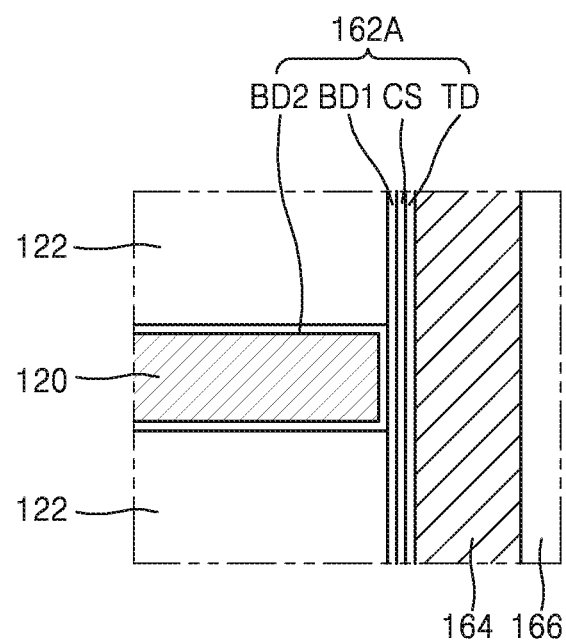
Figure 6C:
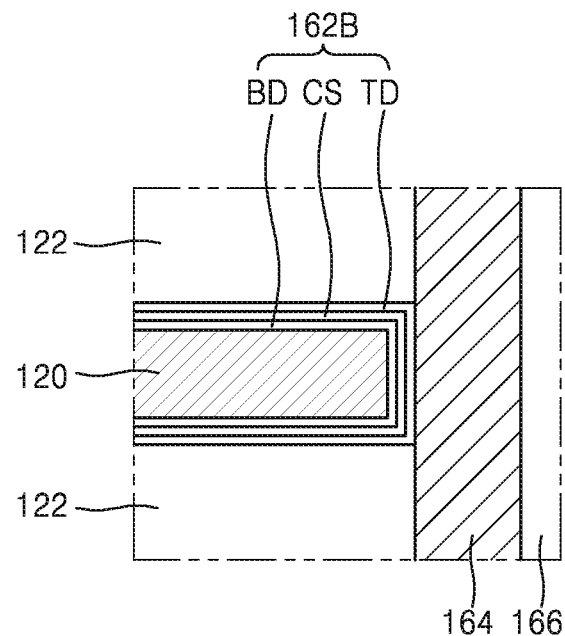
Figure 6D:
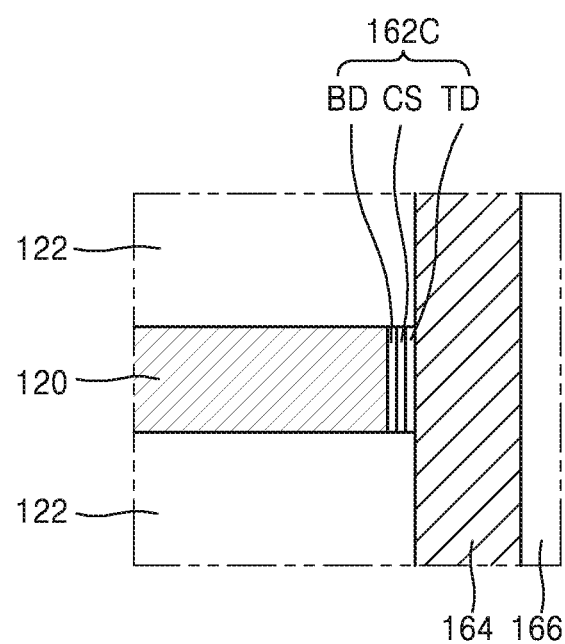

FIGS. 6B to 6D are cross-sectional views of example structures of gate insulating layers 162A, 162B, and 162C that may be employed instead of the gate insulating layer 162 shown in FIG. 6A.

According to some embodiments, the semiconductor device 100 may include the gate insulating layer 162A shown in FIG. 6B instead of the gate insulating layer 162. The gate insulating layer 162A may have a configuration mostly identical to that of the gate insulating layer 162 shown in FIG. 6A. However, the gate insulating layer 162A includes a first blocking dielectric film BD1 and a second blocking dielectric film BD2 instead of the blocking dielectric film BD. The first blocking dielectric film BD1 may extend alongside the channel layer 164 with the tunneling dielectric film TD and the charge storage film CS, and the second blocking dielectric film BD2 may surround the lower gate electrodes 120. Each of the first blocking dielectric film BD1 and the second blocking dielectric film BD2 may include silicon oxide, silicon nitride, or a metal oxide. For example, the first blocking dielectric film BD1 may be a silicon oxide film, and the second blocking dielectric film BD2 may be a metal oxide film having a higher dielectric constant than that of a silicon oxide film.

In some other embodiments, the semiconductor device 100 may include the gate insulating layer 162B shown in FIG. 6C instead of the gate insulating layer 162. The gate insulating layer 162B may have a surface facing the channel layer 164 of the lower gate electrode 120 and surfaces facing the lower insulating layer 122 and may cover the bottom surface, the top surface, and the sidewalls of the lower gate electrode 120. The gate insulating layer 162B may include the tunneling dielectric film TD, the charge storage film CS, and the blocking dielectric film BD sequentially formed on the channel layer 164.

In some other embodiments, the semiconductor device 100 may include the gate insulating layer 162C shown in FIG. 6D instead of the gate insulating layer 162. The gate insulating layer 162C may be only between the lower gate electrodes 120 and the channel layer 164 to cover only the sidewalls of the lower gate electrodes 120 without covering the bottom surface and the top surface of the lower gate electrodes 120. The gate insulating layer 162C may include the tunneling dielectric film TD, the charge storage film CS, and the blocking dielectric film BD sequentially formed on the channel layer 164.

The configurations and shapes of gate dielectric layers that may be included in semiconductor devices according to the example embodiments are not limited to those of the gate insulating layers 162, 162A, 162B, and 162C shown in FIGS. 6A to 6D, and various changes and modifications may be made within the inventive concepts. According to some embodiments, each of the gate insulating layer 162, 162A, 162B, and 162C may include a material whose electrical resistance may be changed by heat generated by a current passing through an electrode adjacent thereto, e.g., a phase change material. The phase change material may include at least one of antimony (Sb), tellurium (Te), and selenium (Se). The phase change material may further include at least one impurity selected from N, O, C, Bi, In, B, Sn, Si, Ti, Al, Ni, Fe, Dy, and La. For example, the gate insulating layers 162, 162A, 162B, and 162C may include GeBiTe, InSb, GeSb, or GaSb. According to some other embodiments, the gate insulating layers 162, 162A, 162B, and 162C may have a thin-film structure in which electrical resistance may be changed by using a current-induced spin transfer process. For example, the gate insulating layers 162, 162A, 162B, and 162C may include a ferromagnetic material or an anti-ferromagnetic material. In some other embodiments, the gate insulating layers 162, 162A, 162B, and 162C may include a Perovskite compound or a transition metal oxide. For example, the gate insulating layers 162, 162A, 162B, and 162C may include niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, or barium-strontium-zirconium oxide.

Referring back to FIG. 3, a second interlayer insulating film 182 may be on the upper insulating layer 132, and a plurality of bit lines BL may extend in the second horizontal direction (Y direction). A bit line connection 184 may be disposed through the second interlayer insulating film 182 to interconnect the bit lines BL to the conductive plugs 168 of the channel structures 150.

Generally, as the number of layers stacked vertically in a memory cell increases, an aspect ratio of a channel hole increases significantly and the difficulty of a channel hole etching process increases, and thus the number of stacked memory cells may be limited. In the case of using a method of forming a lower stacked structure first, forming a lower channel hole through the lower stacked structure, forming an upper stacked structure, and then forming an upper channel hole through the upper stacked structure, since the aspect ratio of an upper or lower channel hole may be reduced, the number of stacked memory cells may be increased. However, a mask pattern may be misaligned or a substrate may be bent or warped during a channel hole etching process and, when a channel structure in a lower channel hole and a channel structure in an upper channel hole are not precisely aligned with each other, electrical characteristics of a semiconductor device may be deteriorated.

However, according to some example embodiments, the first and second landing pads 156A and 156B are formed between the first and second lower channel structures 152A and 152B and the first and second upper channel structures 154A and 154B. Therefore, even when a mask pattern is misaligned or a substrate is warped, sufficient electric connection may be ensured between the first and second lower channel structures 152A and 152B and the first and second upper channel structures 154A and 154B via the first and second landing pads 156A and 156B. Furthermore, since the first channel structure 150A and the second channel structure 150B closest thereto have the first and second landing pads 156A and 156B having largest horizontal widths at different levels, a short-circuit between the channel structures 150A and 150B of the plurality of channel structures 150 at a relatively small distance apart from each other may be prevented. Therefore, the semiconductor device 100 may have improved integration and excellent electrical characteristics.

Figure 7:
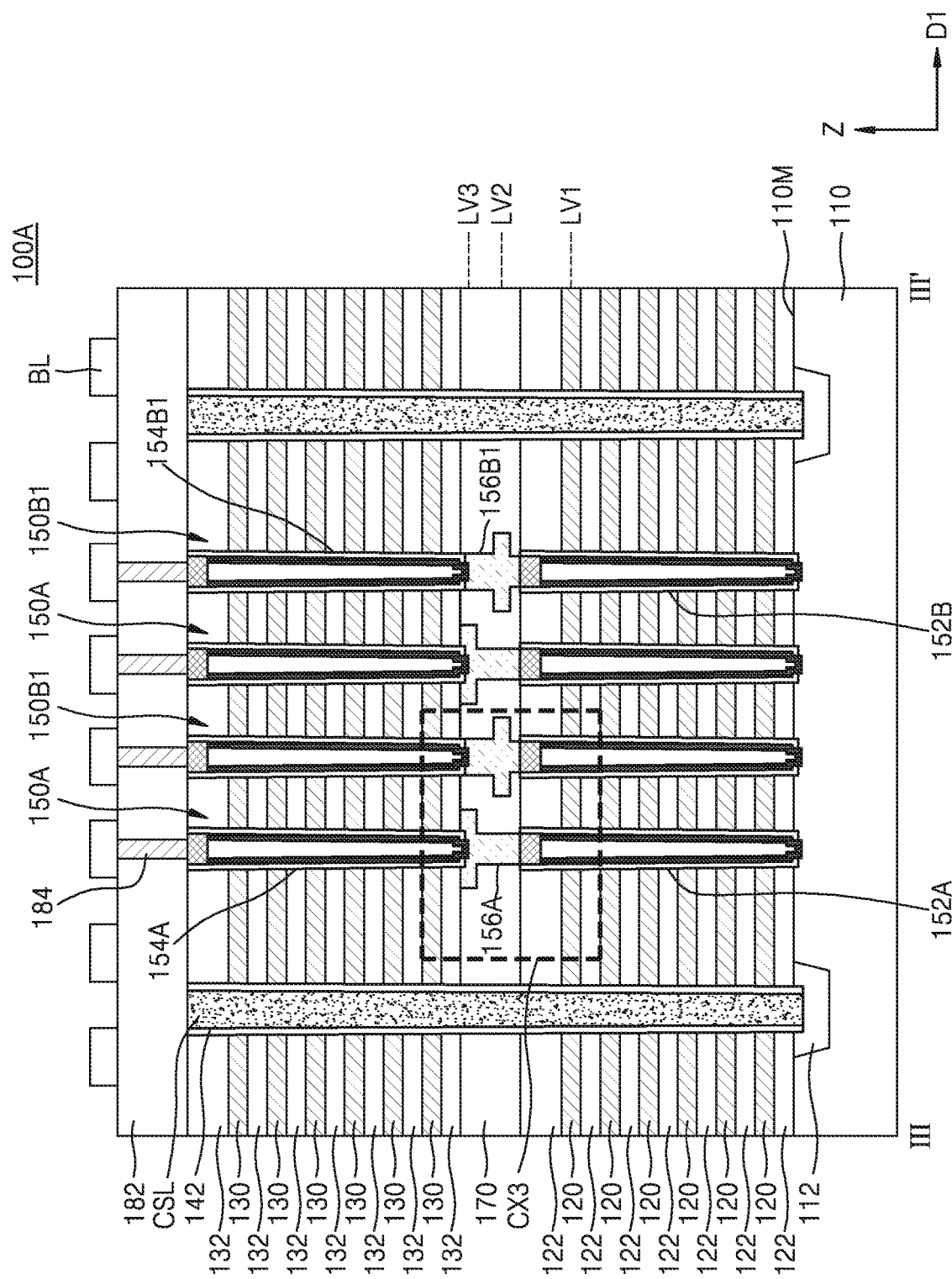
FIG. 7 is a cross-sectional view of a semiconductor device according to some example embodiments.
Figure 8:
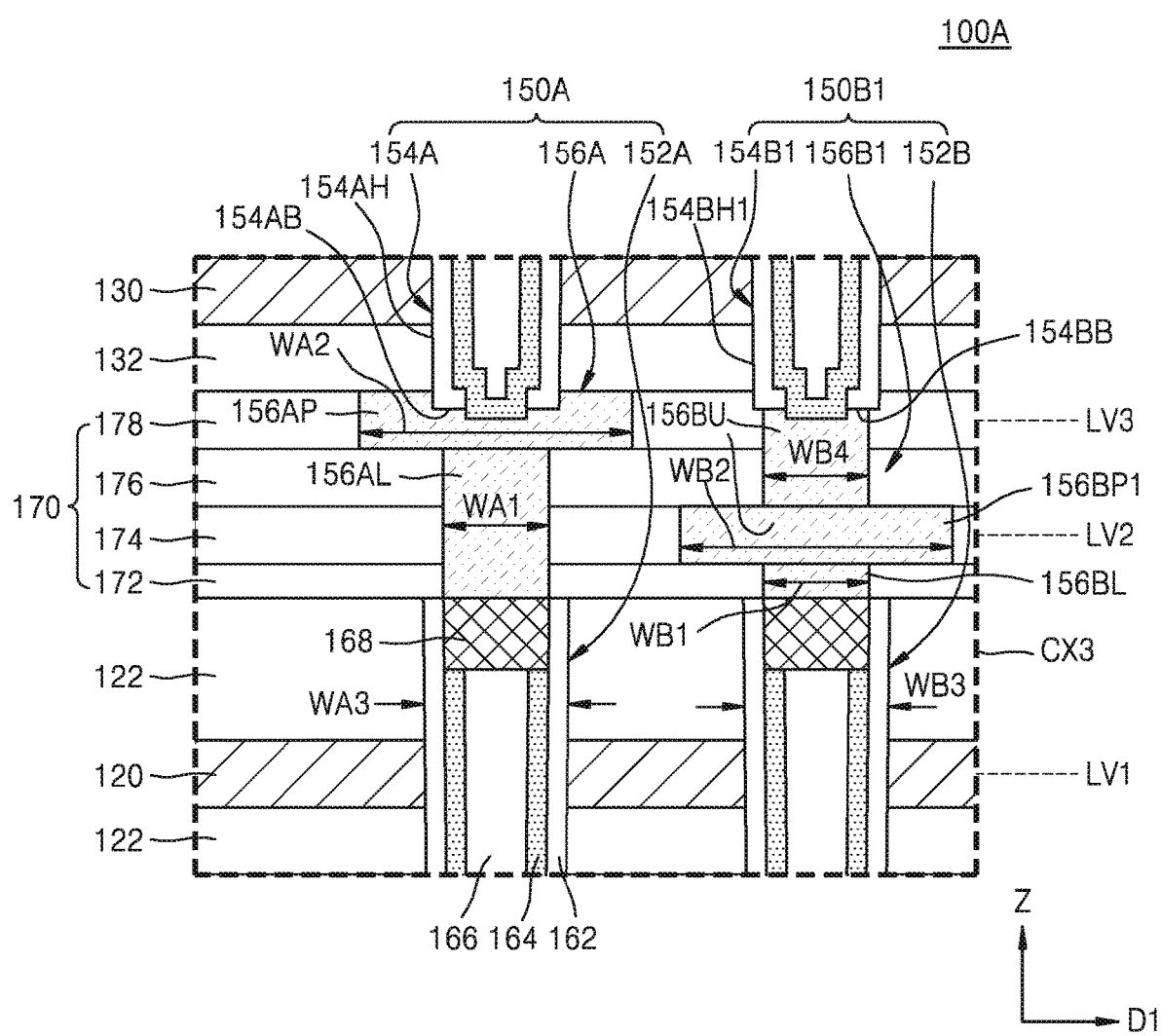
FIG. 8 is an enlarged view of a portion CX3 of FIG. 7.

FIG. 7 is a cross-sectional view of a semiconductor device 100A according to some example embodiments, and FIG. 8 is an enlarged view of a portion CX3 of FIG. 7. In FIGS. 7 and 8, reference numerals same as those in FIGS. 1 to 6D denote the same components.

Referring to FIGS. 7 and 8, a second channel structure 150B1 may include the second lower channel structure 152B, a second upper channel structure 154B1, and a second landing pad 156B1. The structure of the second landing pad 156B1 may be different from that of the second landing pad 156B described above with reference to FIGS. 2 to 5C.

For example, the second landing pad 156B1 may include the second lower connection 156BL, a second pad 156BP1, and a second upper connection 156BU. The second upper connection 156BU may be on the second pad 156BP1 and may have a horizontal width WB4 that is substantially less than a horizontal width WB2 of the second pad 156BP1 or a horizontal width WB3 of the second lower channel structure 152B (e.g., the horizontal width WB4 may be equal to or less than 90% of the horizontal width WB2 and/or may be equal to or less than 90% of the horizontal width WB3).

The bottom surface 154BB of the second upper channel structure 154B1 may contact the top surface of the second upper connection 156BU (and thus may contact the second upper connection 156BU), and the bottom surface of the second upper channel structure 154B1 may be at a level similar to that of the bottom surface of the first upper channel structure 154A. As referred to herein, a level that is "similar to" another level will be understood to have a magnitude that is within 10% of the magnitude of the other level.

In an example process, during an etch process for forming a second upper channel hole 154BH1, the second upper channel hole 154BH1 may be etched so that the top surface of the second upper connection 156BU is exposed. In this case, the bottom surface of the second upper channel structure 154B1 may be at a level similar to that of the bottom surface of the first upper channel structure 154A.

Figure 9:
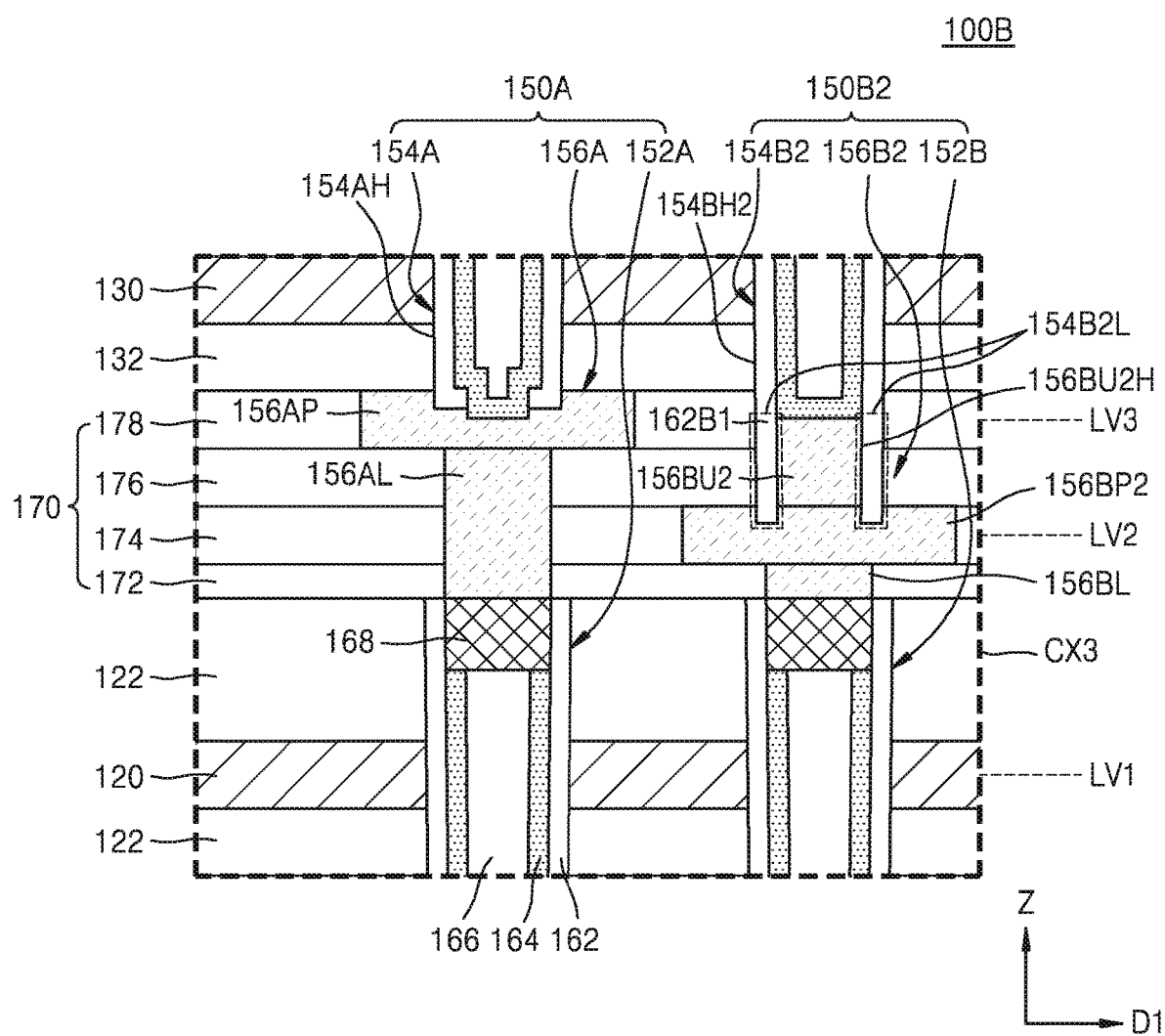
FIG. 9 is a cross-sectional view of a semiconductor device according to some example embodiments.

FIG. 9 is a cross-sectional view of a semiconductor device 100B according to some example embodiments. FIG. 9 is an enlarged cross-sectional view of a portion corresponding to the portion CX3 in FIG. 7. In FIG. 9, reference numerals same as those in FIGS. 1 to 8 denote the same components.

Referring to FIG. 9, a second channel structure 150B2 may include the second lower channel structure 152B, a second upper channel structure 154B2, and a second landing pad 156B2. The structure of the second landing pad 156B2 may be different from that of the second landing pad 156B described above with reference to FIGS. 2 to 5C.

For example, the second landing pad 156B2 may include the second lower connection 156BL, a second pad 156BP2, and a second upper connection 156BU2. The second upper connection 156BU2 may have the horizontal width WB4 (refer to FIG. 8) that is substantially less than the horizontal width WB3 (refer to FIG. 8) of the second pad 156BP2 or the second lower channel structure 152B.

The bottom surface of the second upper channel structure 154B2 may contact the top surfaces of the second upper connection 156BU2 and the second pad 156BP2, and the bottom portion 154B2L (also referred to herein as a lower portion) of the second upper channel structure 154B2 may surround (e.g., surround in a horizontal direction D1) one or more outer surfaces 156BU2H of the second upper connection 156BU2. FIG. 9 shows that the bottom surface of the second upper channel structure 154B2 contacts both the second upper connection 156BU2 and the second pad 156BP2 and extends to a level substantially lower than that of the bottom surface of the first upper channel structure 154A.

According to an example process, during an etching process for forming a second upper channel hole 154BH2, when the second upper channel hole 154BH2 is etched to a width greater than that of the second upper connection 156BU2, the first interlayer insulating film 170 outside the second upper connection 156BU2 is also removed, and thus the second upper channel hole 154BH2 may be etch-stopped by the second pad 156BP2. In this case, an extension 162B1 of the gate insulating layer 162 may cover the sidewall of the second upper channel hole 154BH2. The extension 162B1 of the gate insulating layer 162 may surround the outer surface of the second upper connection 156BU2.

In other embodiments, in the etching process to form the second upper channel hole 154BH2, when the second upper channel hole 154BH2 is etched to a width substantially greater than that of the second upper connection 156BU2 or a width substantially greater than that shown in FIG. 9, the channel layer 164 may extend further downward and surround a portion of the outer surface of the second upper connection 156BU2 unlike the structure shown in FIG. 9. According to some example embodiments, the contact area between the second upper connection 156BU2 and the channel layer 164 may be further increased, thereby improving electrical characteristics.

Although FIG. 9 shows that the top surface of the second upper connection 156BU2 is substantially flat, the inventive concepts is not limited thereto. For example, the top surface of the second upper connection 156BU2 may be rounded or tilted, and only a portion of the side surface of the second upper connection 156BU2 may contact the extension 162B1 of the gate insulating layer 162. Furthermore, a portion of the side surface of the second upper connection 156BU2 may contact the extension 162B1 of the gate insulating layer 162, and a portion of the side surface of the second upper connection 156BU2 may contact the channel layer 164. Furthermore, although FIG. 9 shows that the extension 162B1 of the gate insulating layer 162 extends to a level substantially lower than that of the top surface of the second pad 156BP2, the extension 162B1 of the gate insulating layer 162 may surround only a portion of the side surface of the second upper connection 156BU2 and may not contact the second pad 156BP2.

According to some example embodiments, the first and second landing pads 156A and 156B2 may prevent misalignment of a mask pattern in an etching process for forming the first and second upper channel holes 154AH and 156BH2 or misalignment of the first and second upper channel holes 154AH and 156BH2, which is due to warping or bending of the substrate 110, and ensure sufficient electrical connection between the first and second upper channel structures 154A and 154B2 and the first and second lower channel structures 152A and 152B.

Figure 10:
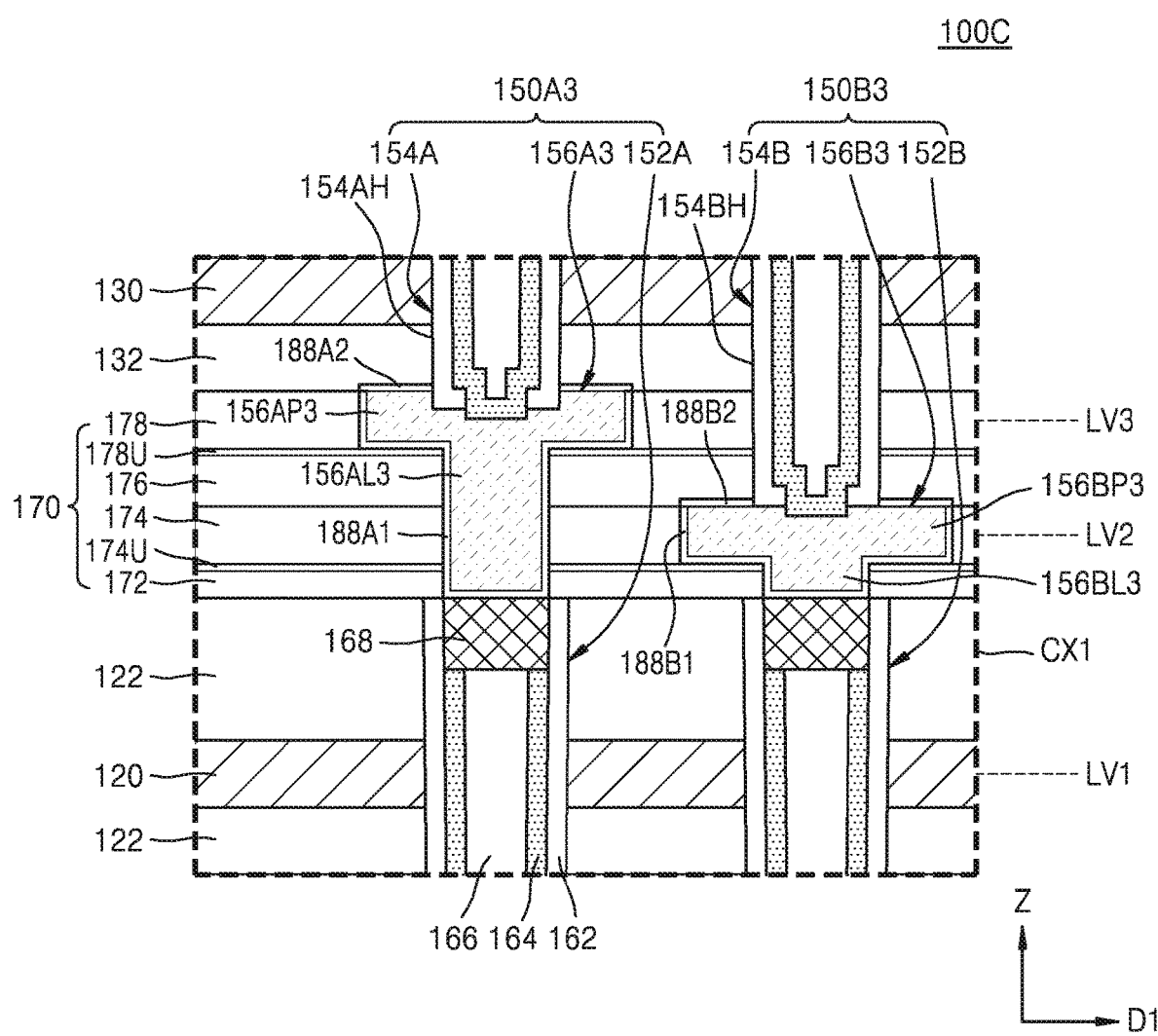
FIG. 10 is a cross-sectional view of a semiconductor device according to some example embodiments.

FIG. 10 is a cross-sectional view of a semiconductor device 100C according to some example embodiments. FIG. 10 is an enlarged cross-sectional view of a portion corresponding to the portion CX1 in FIG. 3. In FIG. 10, reference numerals same as those in FIGS. 1 to 9 denote the same components.

Referring to FIG. 10, the first interlayer insulating film 170 may include first to fourth insulating layers 172, 174, 176, and 178 and first and second etch stop layers 174U and 178U. When a first landing pad 156A3 of a first channel structure 150A3 and a second landing pad 156B3 of a second channel structure 150B3 are formed through a damascene process or a dual damascene process, the first and second etch stop layers 174U and 178U may be formed in the first interlayer insulating film 170.

In particular, in the first landing pad 156A3, a first pad 156AP3 and a lower connection 156AL3 may include a same material, and the first pad 156AP3 and the lower connection 156AL3 may be integrally connected to each other, and thus the boundary between the first pad 156AP3 and the lower connection 156AL3 may not be visible. In the second landing pad 156B3, a second pad 156BP3 and a second lower connection 156BL3 may include a same material, and the second pad 156BP3 and the second lower connection 156BL3 may be integrally connected to each other, and thus the boundary between the second pad 156BP3 and the second lower connection 156BL3 may not be visible.

A conductive barrier layer 188A1 may be formed between the first landing pad 156A3 and first to fourth insulating layers 172, 174, 176, and 178, and a conductive barrier layer 188A2 may be formed between the first landing pad 156A3 and the lowermost upper insulating layer 132. Meanwhile, a conductive barrier layer 188B1 may be formed between the second landing pad 156B3 and first and second insulating layers 172 and 174, and a conductive barrier layer 188B2 may be formed between the second landing pad 156B3 and a third insulating layer 176. For example, the first landing pad 156A3 and the second landing pad 156B3 may include a combination of tungsten, cobalt, nickel, and silicides thereof. Conductive barrier layers 188A1, 188A2, 188B1, and 188B2 may include a conductive material such as titanium, titanium nitride, tantalum, and tantalum nitride, etc.

Figure 11:
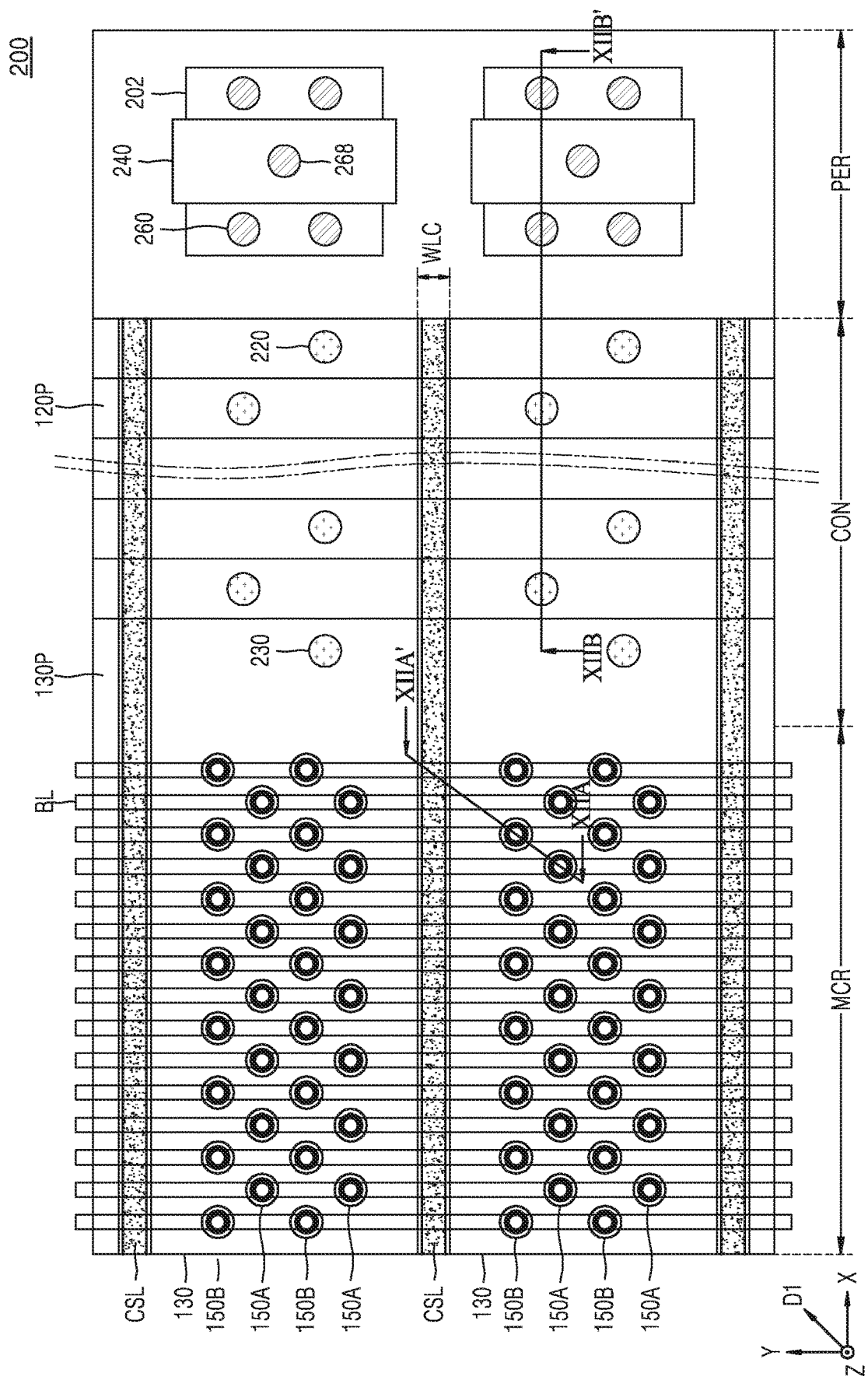
FIG. 11 is a plan view diagram showing a typical configuration of a semiconductor device according to some example embodiments.
Figure 12:
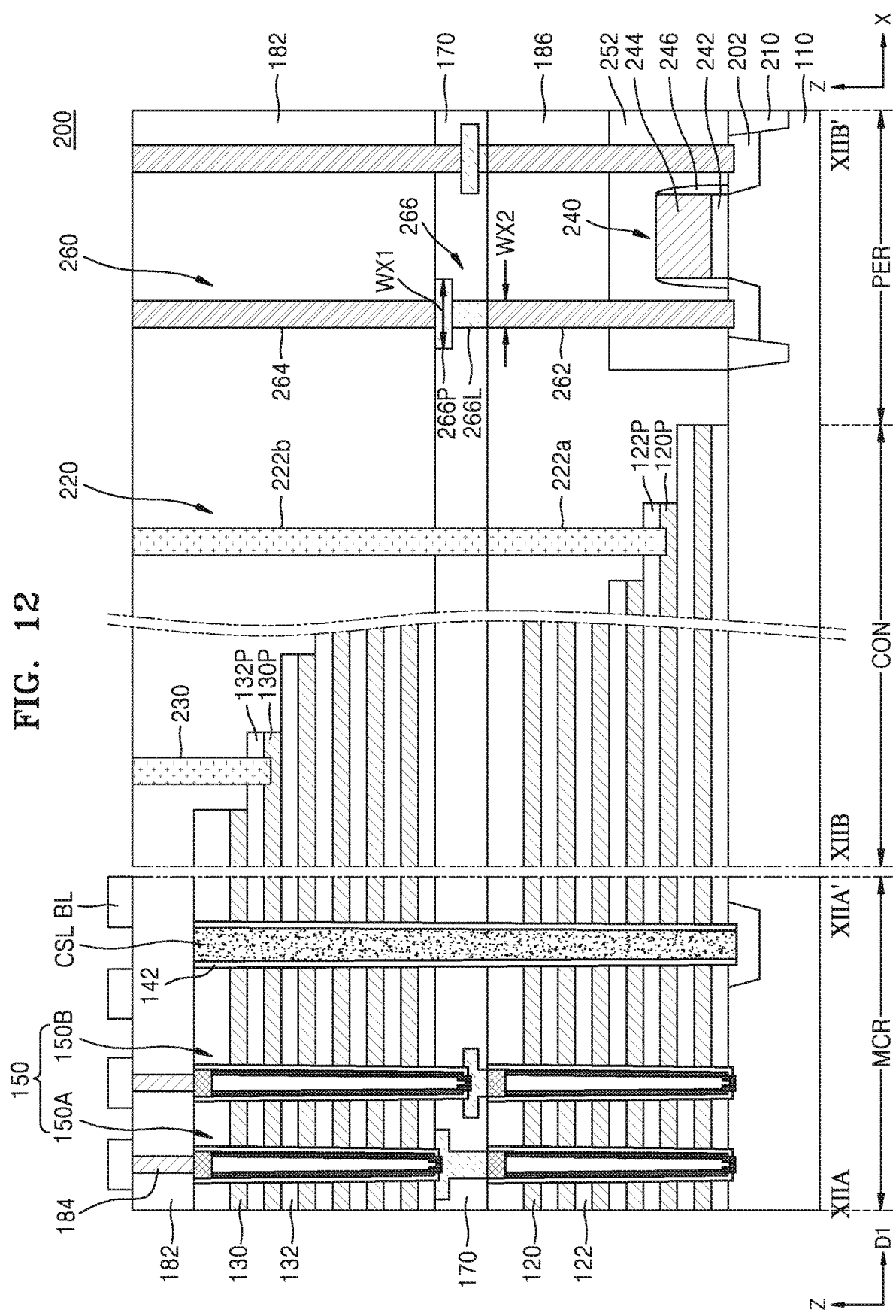
FIG. 12 is a cross-sectional view, taken along a line XIIA-XIIA' and a line XIIB-XIIB' in FIG. 11.

FIG. 11 is a plan view diagram showing a typical configuration of a semiconductor device 200 according to some example embodiments, and FIG. 12 is a cross-sectional view, taken along a line XIIA-XIIA' and a line XIIB-XIIB' in FIG. 11.

Referring to FIGS. 11 and 12, the substrate 110 may include a memory cell region MCR, a connection region CON at edge portions of the memory cell region MCR, and a peripheral circuit region PER at one side of the connection region CON and thus on at least one side of the memory cell region MCR. As shown in at least FIG. 12, the lower gate electrodes 120, the upper gate electrodes 130, and the channel structures 150 may be on the memory cell region MCR of the substrate 110.

The connection region CON may include lower pad lines 120P extending from the lower gate electrodes 120, upper pad lines 130P extending from the upper gate electrodes 130, a plurality of lower cell contacts 220 connected to the lower pad lines 120P, and a plurality of upper cell contacts 230 connected to the upper pad lines 130P.

As shown in FIG. 12, the lower pad lines 120P and the upper pad lines 130P may have stepped shapes in the connection region CON. A lower pad insulating layer 122P may be on the lower pad lines 120P and an upper pad insulating layer 132P may be on the upper pad lines 130P. As distances between the substrate 110 and the gate electrodes 120 and 130 increase, lengths of the lower pad lines 120P and the upper pad lines 130P in the connection region CON may decrease. A third interlayer insulating film 186 may be on the substrate 110 to cover the lower pad lines 120P and the second interlayer insulating film 182 may be on the first interlayer insulating film 170 to cover the upper pad lines 130P.

The lower cell contacts 220 may penetrate through the second interlayer insulating film 182 and the third interlayer insulating film 186 and be disposed on the lower pad lines 120P, whereas the upper cell contacts 230 may penetrate through the second interlayer insulating film 182 and be disposed on the upper pad lines 130P.

In example embodiments, each of the lower cell contacts 220 may include a first lower cell contact 222a at a level same as that of the lower gate electrodes 120 and a second lower cell contact 222b on the first lower cell contact 222a. For example, the lower gate electrodes 120 may be formed first, the first lower cell contact 222a may be formed, the upper gate electrodes 130 may be formed, and then the second lower cell contacts 222b may be formed. In this case, the difficulty of a process for forming the lower cell contacts 220 may be reduced. However, the inventive concepts is not limited thereto, and the lower cell contacts 220 may be formed as an integral structure penetrating through the second interlayer insulating film 182 and the third interlayer insulating film 186. In other embodiments, a cell contact landing pad (not shown) may be further formed between the first lower cell contact 222a and the second lower cell contact 222b. The cell contact landing pad may have a structure similar to those of the first and second landing pads 156A and 156B of the memory cell region MCR and may also be formed together in the process for forming the first and second landing pads 156A and 156B of the memory cell region MCR.

A driving circuit gate structure 240 and driving circuit contact structures 260 and 268 may be in the peripheral circuit region PER of the substrate 110. An active region (not shown) may be defined in the substrate 110 by an isolation film 210, the driving circuit gate structure 240 may be in the active region, and an impurity region 202 may be in portions of the substrate 110 on both sides of the driving circuit gate structure 240.

The driving circuit gate structure 240 may include a driving circuit gate insulating layer 242, a driving circuit gate electrode 244, and a spacer 246, and a fourth interlayer insulating film 252 covering the driving circuit gate structure 240 may be disposed on the substrate 110. The driving circuit gate structure 240 may configure various circuits for driving a plurality of memory cells in the memory cell region MCR. For example, the driving circuit gate structure 240 may be some of driving transistors for performing functions of control logic, a row decoder, a column decoder, a sense amplifier, a page buffer, and the like.

Driving circuit contact structures 260 and 268 may be connected to the impurity region 202 and the driving circuit gate electrode 244, respectively. For example, the driving circuit contact structures 260 and 268 may include a driving circuit lower contact 262, a first driving circuit upper contact 264, and a driving circuit landing pad 266. The driving circuit landing pad 266 may include a pad 266P and a lower connection 266L. The driving circuit landing pad 266 may have a structure similar to those of the first and second landing pads 156A and 156B of the memory cell region MCR and may also be formed together in the process for forming the first and second landing pads 156A and 156B of the memory cell region MCR.

As referred to herein, the impurity region 202 and/or the driving circuit gate electrode 244 may be referred to herein as a "peripheral circuit element" on the peripheral circuit region PER, and the driving circuit contact structures 260 and 268 may each be referred to as a peripheral circuit contact structure that is connected and/or coupled to the aforementioned peripheral circuit element, where the peripheral circuit element and the peripheral circuit contact structure are on the peripheral circuit region PER. As further referred to herein, a peripheral circuit contact structure (e.g., driving circuit contact structure 260) may include a lower contact (e.g., driving circuit lower contact 262) that is coupled and/or connected (e.g., "directly coupled") to the peripheral circuit element (e.g., impurity region 202 and/or driving circuit gate electrode 244), a third landing pad (e.g., driving circuit landing pad 266) on the lower contact, and an upper contact (e.g., a first driving circuit upper contact 264) on the third landing pad. As further shown in FIG. 12, a horizontal width (e.g., WX1) of the third landing pad (e.g., driving circuit landing pad 266) may be substantially greater than (e.g., equal to or greater than 110% of) the horizontal width (e.g., WX2) of the lower contact (e.g., driving circuit lower contact 262).

When a driving circuit contact for providing an electrical connection to the driving circuit gate structure 240 is formed, the aspect ratio of a contact hole may be significantly increased, and thus it may become difficult to precisely control a process for etching the contact hole or the resistance of the driving circuit contact may increase. However, according to some example embodiments, the driving circuit contact structures 260 and 268 include the driving circuit landing pad 266, and the driving circuit lower contact 262 and the first driving circuit upper contact 264 may be formed through separate processes. Therefore, the aspect ratio of a contact hole is reduced in a process for etching each contact hole, and thus the process for etching the contact hole may be precisely controlled. Furthermore, even when the substrate 110 is bent or warped or a mask pattern is misaligned, sufficient electrical connection between the driving circuit lower contact 262 and the first driving circuit upper contact 264 may be secured by the driving circuit landing pad 266.

Figure 13:
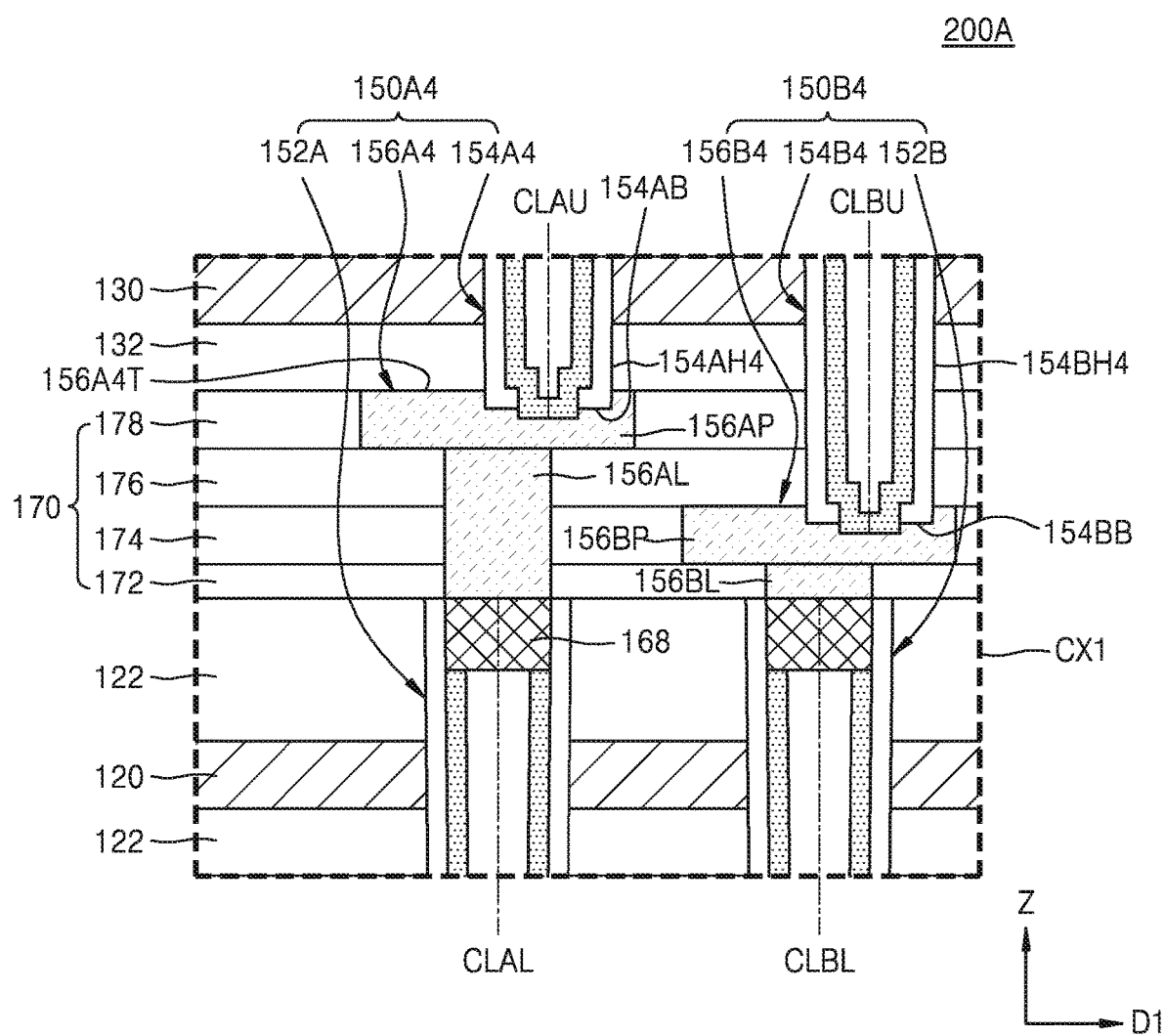
FIG. 13 is a cross-sectional view of a semiconductor device according to some example embodiments.

FIG. 13 is a cross-sectional view of a semiconductor device 200A according to some example embodiments. FIG. 13 is an enlarged cross-sectional view of a portion corresponding to the portion CX1 in FIG. 3. In FIG. 13, reference numerals same as those in FIGS. 1 to 12 denote the same components.

Referring to FIG. 13, a first channel structure 150A4 and a second channel structure 150B4 may be disposed at portions of the memory cell region MCR adjacent to the connection region CON. In other words, the first channel structure 150A4 and the second channel structure 150B4 may be close to edge regions of the substrate 110.

As shown in FIG. 13, respective center lines (or center axes) CLAU and CLBU of the first and second upper channel structures 154A4 and 154B4 in the vertical direction (Z direction) may be spaced apart from (e.g., isolated from direct contact with), also referred to herein as "offset from," respective center lines (or center axes) CLAL and CLBL of the first and second lower channel structures 152A and 152B in the vertical direction (Z direction), for example, in the third horizontal direction (D1 direction), where the third horizontal direction is parallel or substantially parallel (e.g., parallel within manufacturing tolerances and/or material tolerances) to the top surface (e.g., main surface 110M) of the substrate 110. Furthermore, the upper channel structures 154A4 and 154B4 may partially overlap with the first and second lower channel structures 152A and 152B in vertical directions. As shown in at least FIG. 13, substantially an entire bottom surface 154AB of the first upper channel structures 154A (e.g., the entire bottom surface 154AB within manufacturing tolerances and/or material tolerances) may contact the top surface 156A4T of the first pad 156A4.

In example embodiments, the substrate 110 may be bent or warped or a mask pattern may be misaligned in an etching process for forming the upper channel holes 150AH4 and 150BH4 in the upper gate electrodes 130, and thus the upper channel holes 150AH4 and 150BH4 may be spaced apart from (e.g., isolated from direct contact with) the center lines CLAL and CLBL of the first and second lower channel structures 152A and 152B, for example, in the third horizontal direction (D1 direction). However, even when the substrate 110 is bent or warped, the bottoms of the upper channel holes 150AH4 and 150BH4 may be etch-stopped on the first and second pads 156AP and 156BP, and thus sufficient electrical connections may be secured between the upper channel structures 154A4 and 154B4 formed in the upper channel holes 156AH4 and 150BH4 and the first and second pads 156AP and 156BP, respectively.

Figure 14:
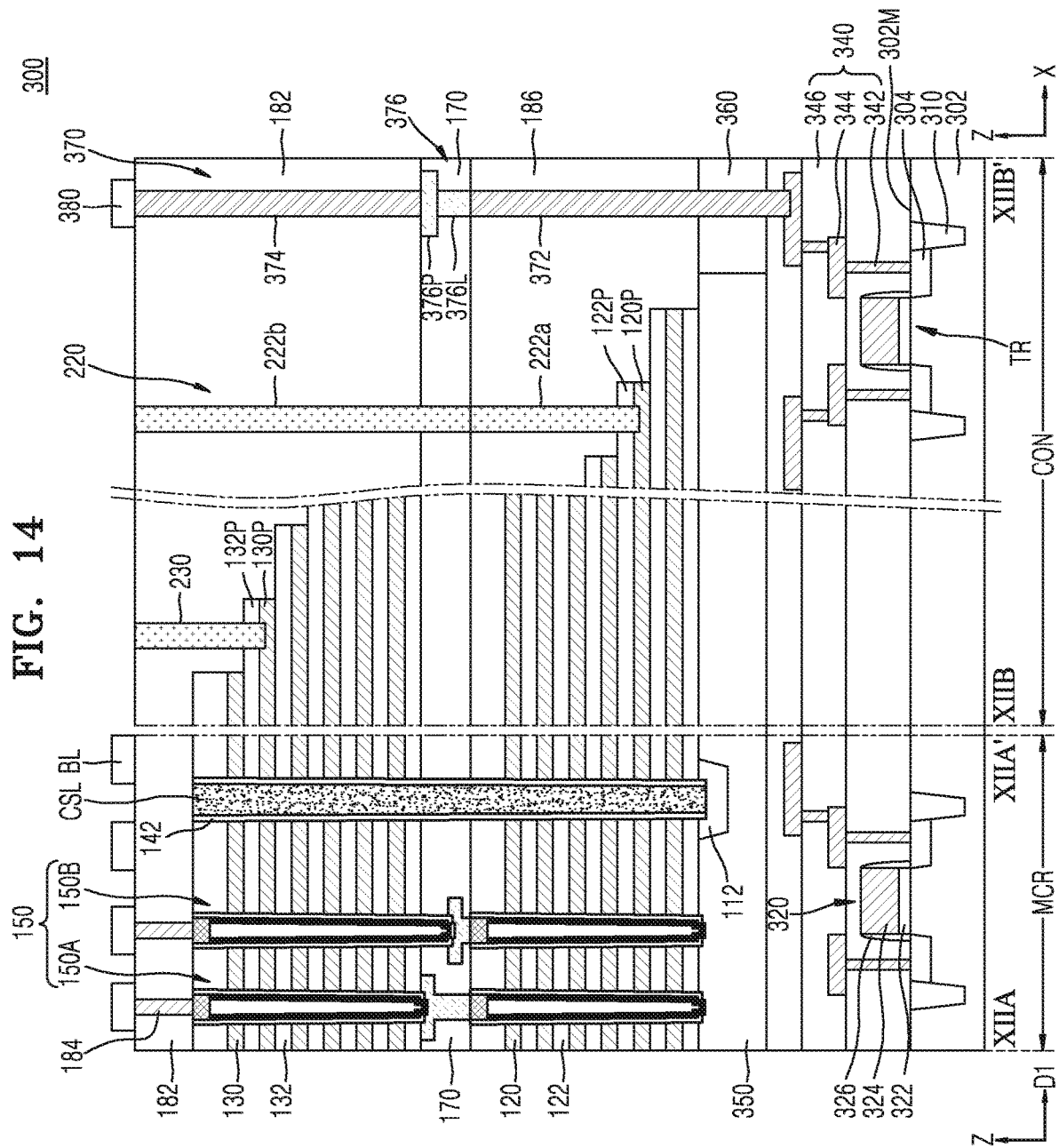
FIG. 14 is a cross-sectional view of a semiconductor device according to some example embodiments.

FIG. 14 is a cross-sectional view of a semiconductor device 300 according to some example embodiments. In FIG. 14, reference numerals same as those in FIGS. 1 to 13 denote the same components.

Referring to FIG. 14, a plurality of driving transistors TR may be formed on a substrate 302. An active region (not shown) may be defined in the substrate 302 by an isolation film 310, a driving circuit gate structure 320 may be in the active region, and an impurity region 304 may be in portions of the substrate 302 on both sides of the driving circuit gate structure 320. The driving circuit gate structure 320 may include a driving circuit gate insulating layer 322, a driving circuit gate electrode 324, and a spacer 326.

A lower layer structure 340 covering the driving circuit gate structure 320 may be on the substrate 302. The lower layer structure 340 may include a plurality of contacts 342, a plurality of wiring layers 344, and a plurality of insulating layers 346. The contacts 342 and the wiring layers 344 may have multi-layered structures in the vertical direction (Z direction), and the contacts 342 and the wiring layers 344 may be electrically connected to the driving transistors TR. The insulating layers 346 may cover the driving circuit gate structure 320, the contacts 342, and the wiring layers 344 on the substrate 302.

A semiconductor layer 350 may be on the lower layer structure 340. The semiconductor layer 350 may be disposed in the memory cell region MCR and may be disposed in a portion of the connection region CON. A semiconductor device as described above with reference to FIGS. 2 to 5C may be above the semiconductor layer 350. Accordingly, as shown in FIG. 14, the memory cell region MCR may be at a level that is higher than a level of the peripheral circuit region PER from the top surface (e.g., main surface 302M) of the substrate 302.

An insulating layer 360 may be outside the semiconductor layer 350 on the lower layer structure 340, and a driving circuit contact structure 370 may penetrate through the insulating layer 360 and electrically connect the lower layer structure 340 to an upper wiring layer 380. The driving circuit contact structure 370 may include a driving circuit lower contact 372, a driving circuit upper contact 374, and a driving circuit landing pad 376, and the driving circuit landing pad 376 may include a pad 376P and a lower connection 376L. The driving circuit contact structure 370 and elements thereof may have the same properties as the driving circuit contact structure 268 and elements thereof as described herein. The driving circuit landing pad 376 may have a structure similar to those of the first and second landing pads 156A and 156B of the memory cell region MCR and may also be formed together in the process for forming the first and second landing pads 156A and 156B of the memory cell region MCR.

FIGS. 15 to 17, 18A to 18C, and 19 to 22 are cross-sectional view diagrams sequentially showing a method of manufacturing the semiconductor device 200 according to some example embodiments.

Figure 15:
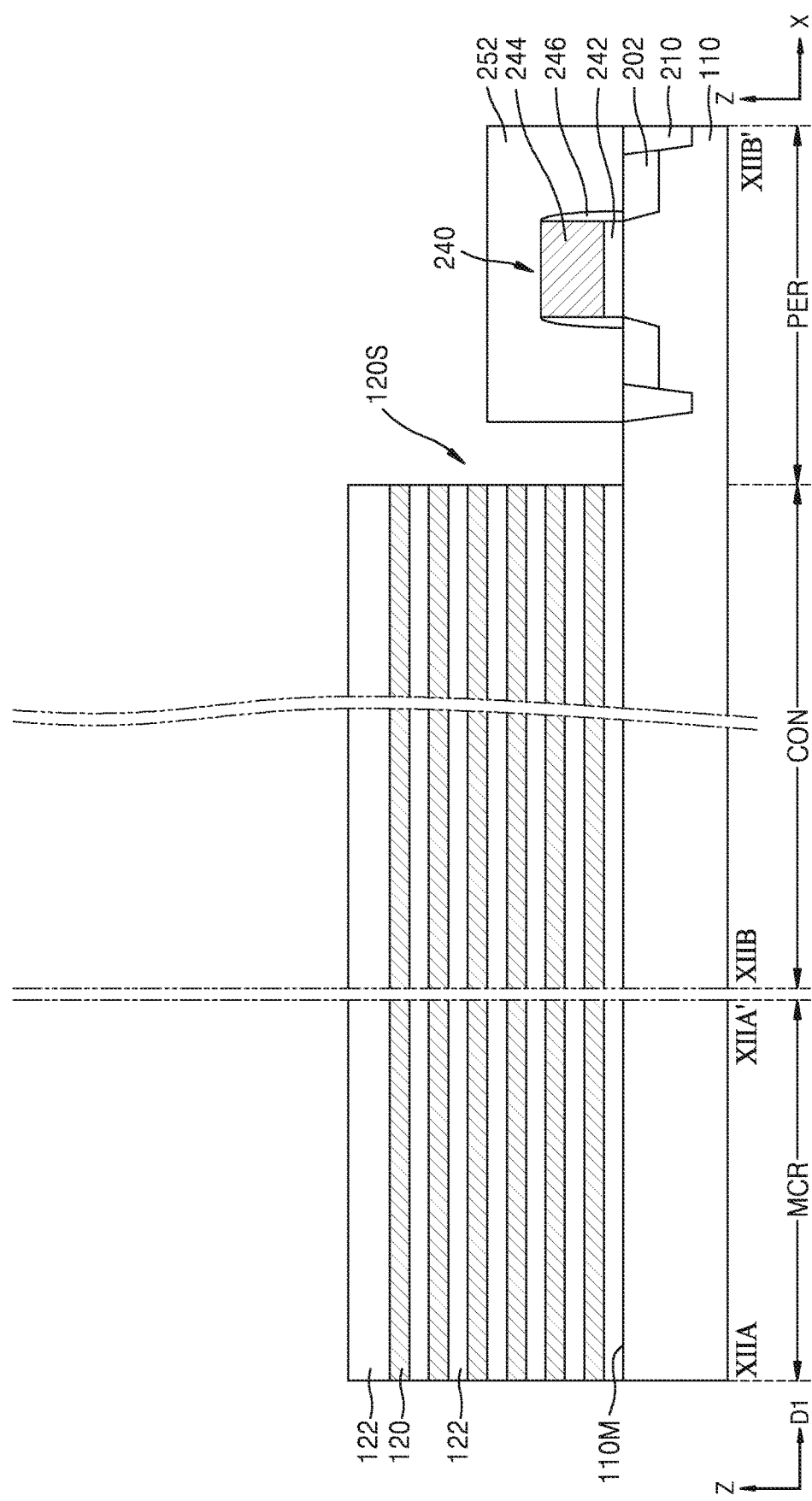
FIGS. 15, 16, and 17, 18A, 18B, and 18C, and 19, 20, 21, and 22 are cross-sectional view diagrams sequentially showing a method of manufacturing a semiconductor device according to some example embodiments.

Referring to FIG. 15, the driving circuit gate structure 240 may be formed on the peripheral circuit region PER of the substrate 110. For example, a gate insulating layer (not shown), a conductive layer (not shown), and a mask pattern (not shown) may be sequentially formed on the main surface 110M of the substrate 110, and the gate insulating layer and the conductive layer may be etched by using the mask pattern, thereby forming the driving circuit gate insulating layer 242 and the driving circuit gate electrode 244. Next, an insulating layer (not shown) may be formed on the driving circuit gate insulating layer 242 and the driving circuit gate electrode 244, and an anisotropic etching may be performed on the insulating layer, thereby forming spacers 246 on the driving circuit gate insulating layer 242 and the sidewalls of a driving circuit gate electrode 244. The fourth interlayer insulating film 252 covering the driving circuit gate structure 240 may be formed on the substrate 110.

Next, a lower gate electrode stack 120S may be formed on portions of the main surface 110M of the substrate 110 in the memory cell region MCR and the connection region CON of the substrate 110. The lower gate electrode stack 120S may include the lower gate electrodes 120 and the lower insulating layer 122 that are alternately disposed.

According to some example embodiments, the lower gate electrodes 120 may include, for example, polysilicon doped with an impurity, and the lower insulating layer 122 may include an insulating material like silicon oxide and silicon oxynitride. However, the inventive concepts is not limited thereto.

According to other embodiments, a plurality of sacrificial layers (not shown) may be formed instead of the lower gate electrodes 120, and the sacrificial layers may be removed in a subsequent process and spaces in which the sacrificial layers were arranged may be filled with a metal for forming the lower gate electrodes 120, thereby forming the lower gate electrodes 120. In this case, the sacrificial layers may include, for example, silicon nitride, silicon oxynitride, or polysilicon doped with an impurity.

Figure 16:
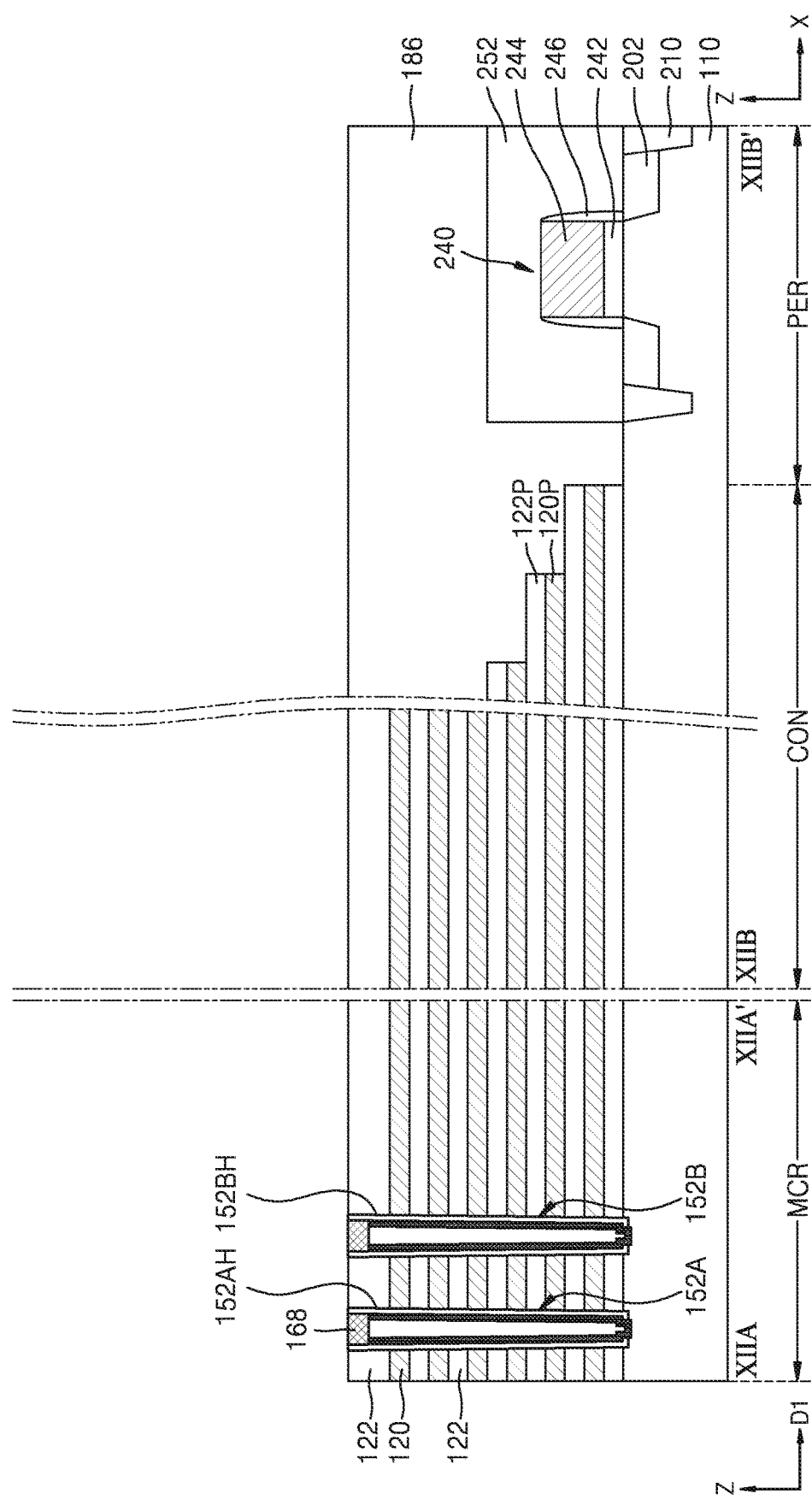

Referring to FIG. 16, the lower pad lines 120P may be formed by sequentially patterning the lower gate electrode stack 120S in the connection region CON. In this process, the lower insulating layer 122 on each of the lower pad lines 120P may also be patterned, and thus the lower pad insulating layers 122P covering the top surfaces of the lower pad lines 120P may be formed.

Next, the first lower channel hole 152AH and the second lower channel hole 152BH may be formed in the lower gate electrode stack 120S. The gate insulating layer 162 (refer to FIG. 4), a channel layer 164 (refer to FIG. 4), and the buried insulating layer 166 (refer to FIG. 4) may be sequentially formed on the inner walls of the first lower channel hole 152AH and the second lower channel hole 152BH. Next, upper portions of the first lower channel hole 152AH and the second lower channel hole 152BH are removed through an etch-back process, and the conductive plug 168 may be formed to block inlets of the first lower channel hole 152AH and the second lower channel hole 152BH.

Therefore, the first lower channel structure 152A and the second lower channel structure 152B may be formed in the first lower channel hole 152AH and the second lower channel hole 152BH, respectively.

Next, an insulating layer (not shown) covering the lower pad lines 120P and the fourth interlayer insulating film 252 may be formed on the substrate 110, and a planarization process may be performed until the top surface of the conductive plug 168 is exposed, thereby forming the third interlayer insulating film 186 covering the lower pad lines 120P and the fourth interlayer insulating film 252.

Figure 17:
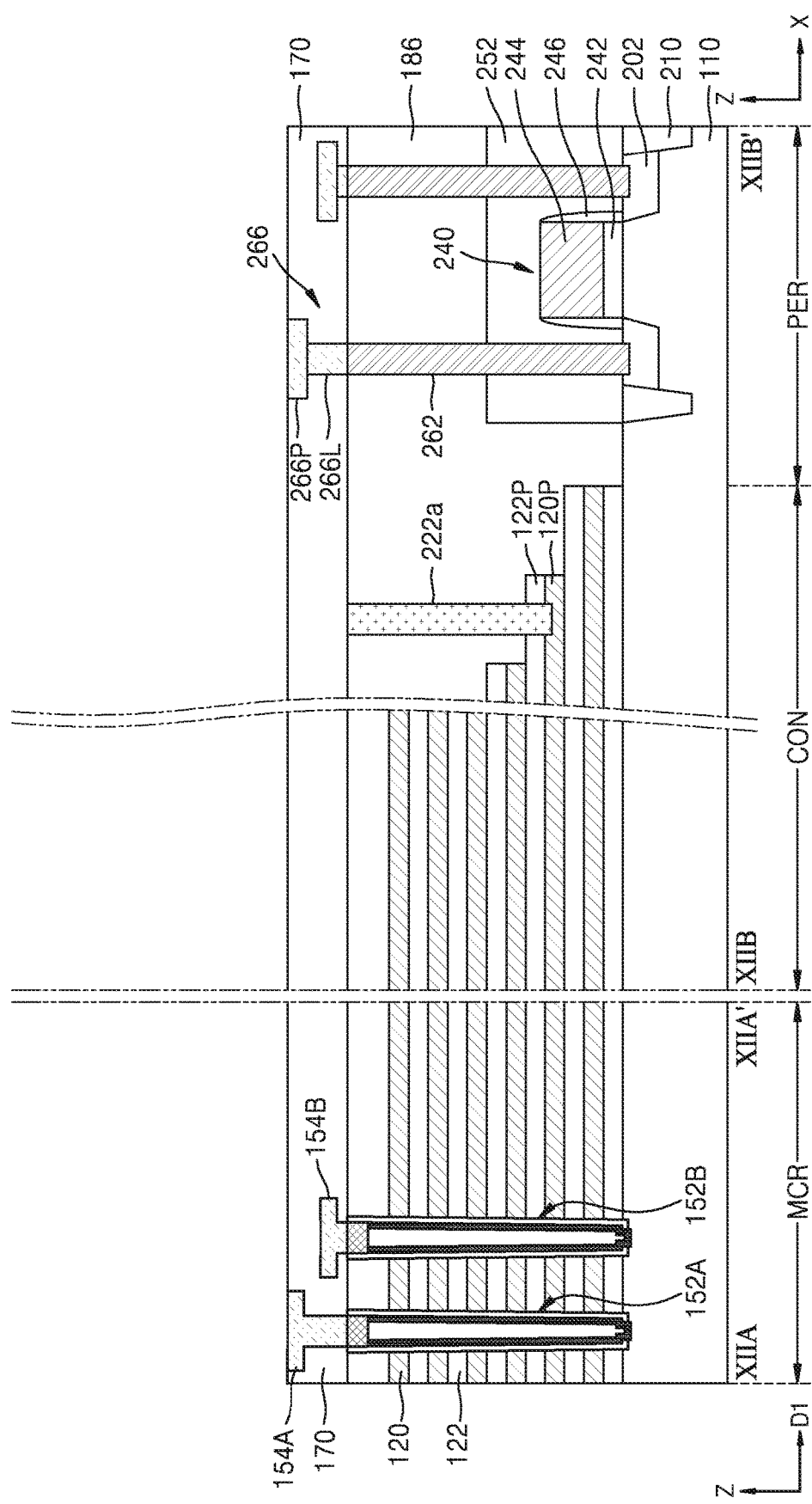

Referring to FIG. 17, the first lower cell contacts 222a connected to the lower pad lines 120P may be formed in the connection region CON, and the driving circuit lower contact 262 connected to the driving circuit gate structure 240 or the impurity region 202 may be formed in the peripheral circuit region PER.

Figure 18A:
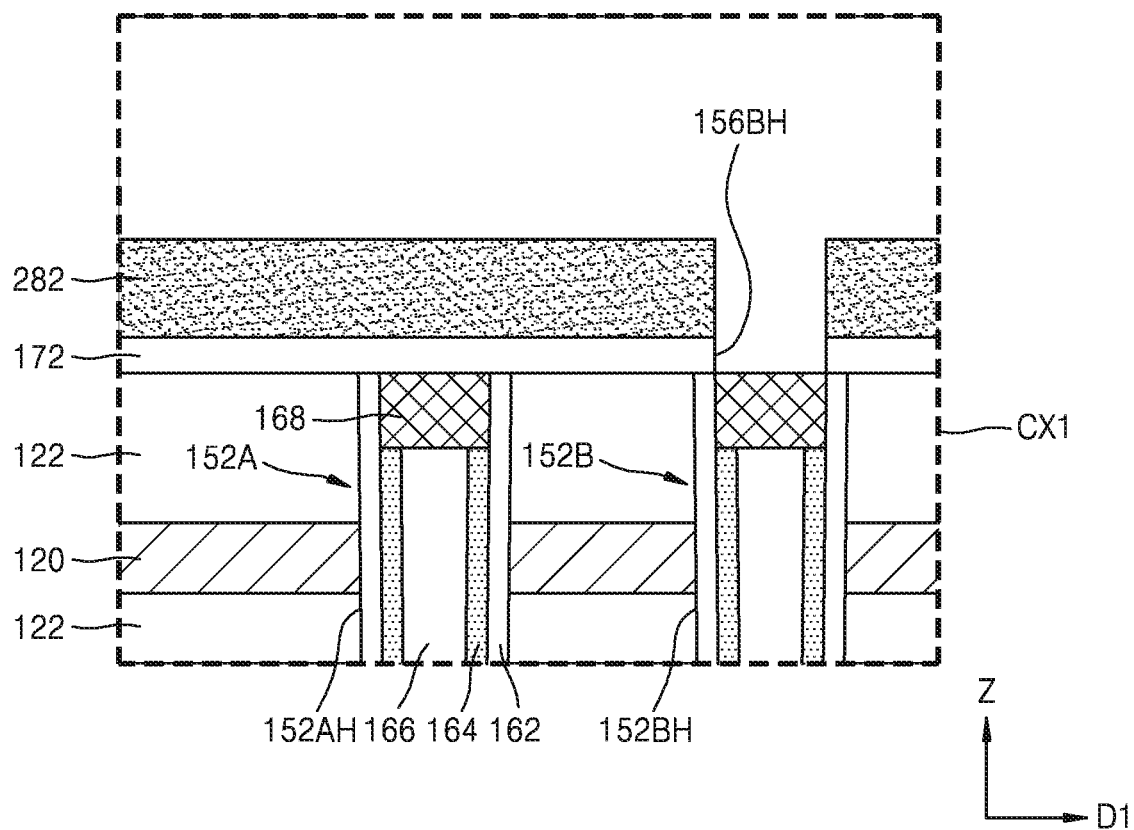
Figure 18B:
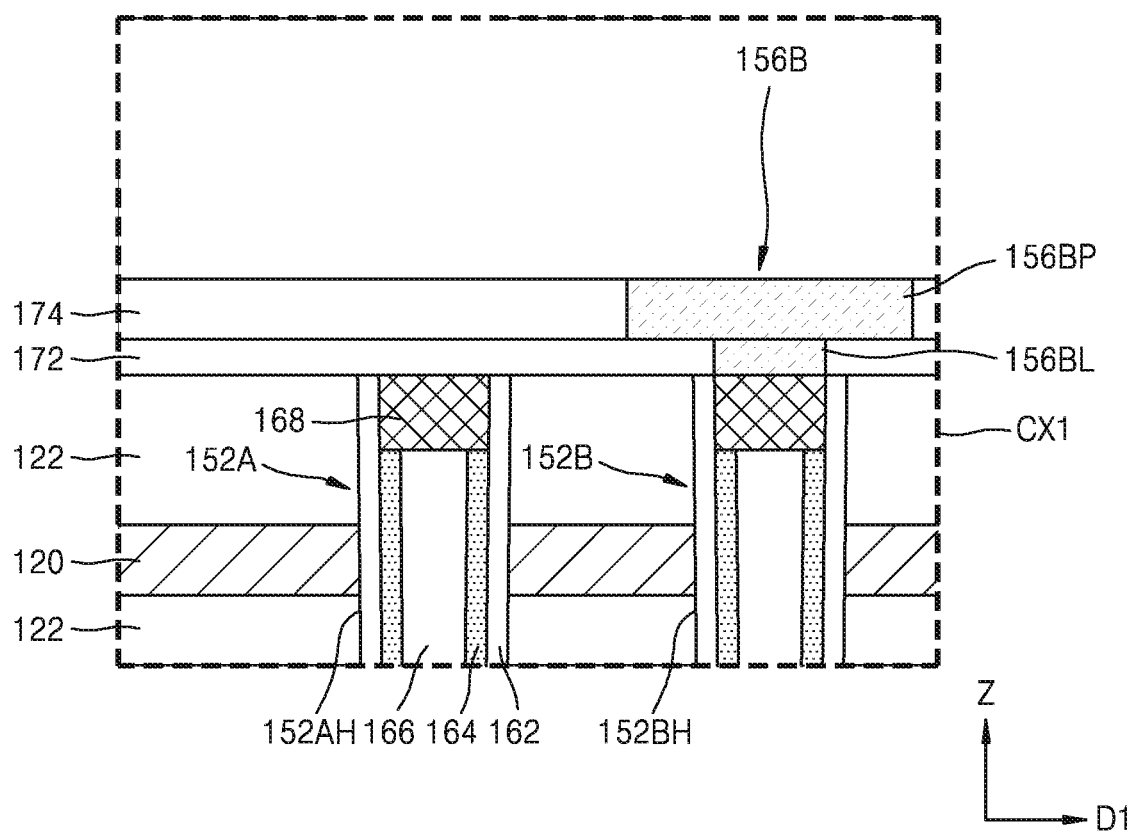
Figure 18C:
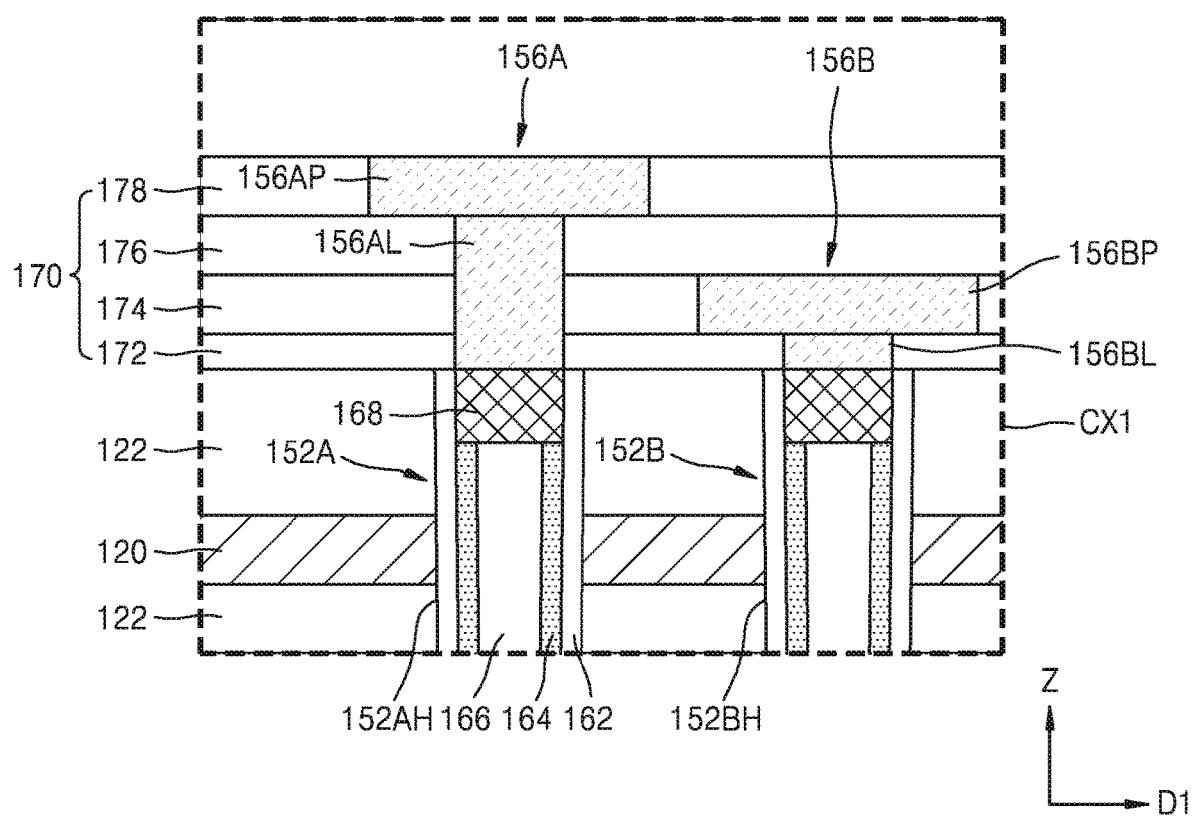

Next, the first interlayer insulating film 170, the first and second landing pads 156A and 156B, and the driving circuit landing pad 266 may be formed on the lower insulating layer 122 and the third interlayer insulating film 186. FIGS. 18A to 18C are enlarged cross-sectional view diagrams sequentially showing operations for forming the first and second landing pads 156A and 156B.

First, referring to FIG. 18A, a first insulating layer 172 is formed on the lower insulating layer 122 and the third interlayer insulating film 186, and the first insulating layer 172 is patterned by using a mask pattern 282, thereby forming a first opening 156BH. The first opening 156BH may expose a portion of the top surface of the second lower channel structure 152B.

Referring to FIG. 18B, a conductive layer (not shown) filling the interior of the first opening 156BH may be formed, and the second lower connection 156BL may be formed within the first opening 156BH by planarizing the conductive layer. Next, a second insulating layer 174 is formed on the first insulating layer 172 and the second lower connection 156BL, and a portion of the second insulating layer 174 is removed by using a mask pattern (not shown) to form a second opening (not shown). Next, the second pad 156BP may be formed by filling the second opening by using a conductive material. Therefore, the second landing pad 156B including the second lower connection 156BL and the second pad 156BP may be formed.

Referring to FIG. 18C, the third insulating layer 176 is formed on the second insulating layer 174, and portions of the first to third insulating layers 172, 174, and 176 are removed by using a mask pattern (not shown). Next, the first lower connection 156AL may be formed by filling the third opening with a conductive material. Next, the fourth insulating layer 178 is formed on the third insulating layer 176, and a fourth opening (not shown) is formed by removing a portion of the fourth insulating layer 178 by using a mask pattern (not shown). Next, the first pad 156AP may be formed by filling the fourth opening with a conductive material. Therefore, the first landing pad 156A including the first lower connection 156AL and the first pad 156AP may be formed.

Optionally, at least one etch stop layer (not shown) may be further formed between the first to fourth insulating layers 172, 174, 176, and 178.

Meanwhile, the driving circuit landing pad 266 may also be formed in the peripheral circuit region PER in a manner similar to that of process for forming the first and second landing pads 156A and 156B in the memory cell region MCR.

Through the process described above with reference to FIGS. 18A to 18C, the first landing pad 156A and the second landing pad 156B having T-shaped cross-sections having upper widths greater than lower widths thereof may be formed. Through the process described above, the bottom surface of the first landing pad 156A is at a level substantially higher than that of the top surface of the second landing pad 156B, and thus the first landing pad 156A and the second landing pad 156B may be a certain distance apart from each other in the vertical direction (Z direction).

According to other example embodiments, a first etch stop layer 174U and the second insulating layer 174 are sequentially formed on the first insulating layer 172, and the first insulating layer 172 and the second insulating layer 174 are removed to form a T-shaped opening, and then the second landing pad 156B3 may be formed by filling the T-shaped opening with the conductive barrier layer 188B1 and a conductive material. In this case, the semiconductor device 100C described above with reference to FIG. 10 may be formed.

According to some example embodiments, during removal of a portion of the fourth insulating layer 178 to form the first pad 156AP in the process described above with reference to FIG. 18C, an opening (not shown) exposing the upper portions of the second pads 156BP1 and 156BP2 may be formed together. Next, the opening may be filled with a conductive material, thereby forming the second upper connections 156BU and 156BU2. In this case, the second landing pads 156B1 and 156B2 including the second upper connections 156BU and 156BU2 may be formed, and thus the semiconductor devices 100A and 100B described above with reference to FIGS. 7 to 9 may be formed.

Figure 19:
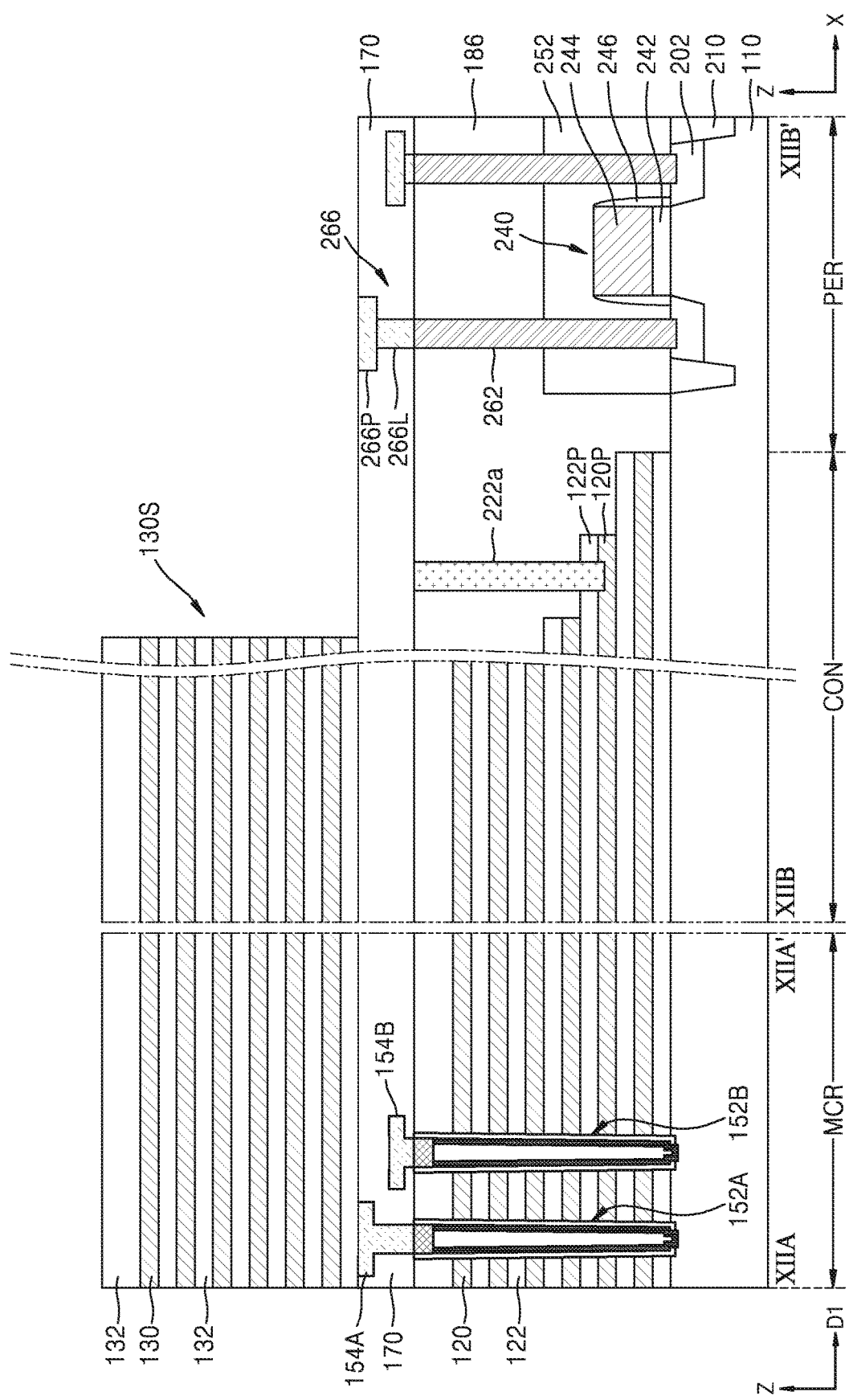

Referring to FIG. 19, an upper gate electrode stack 130S may be formed on portions of the first interlayer insulating film 170 in the memory cell region MCR and the connection region CON. The upper gate electrode stack 130S may include the upper gate electrodes 130 and the upper insulating layer 132 that are alternately disposed.

Figure 20:
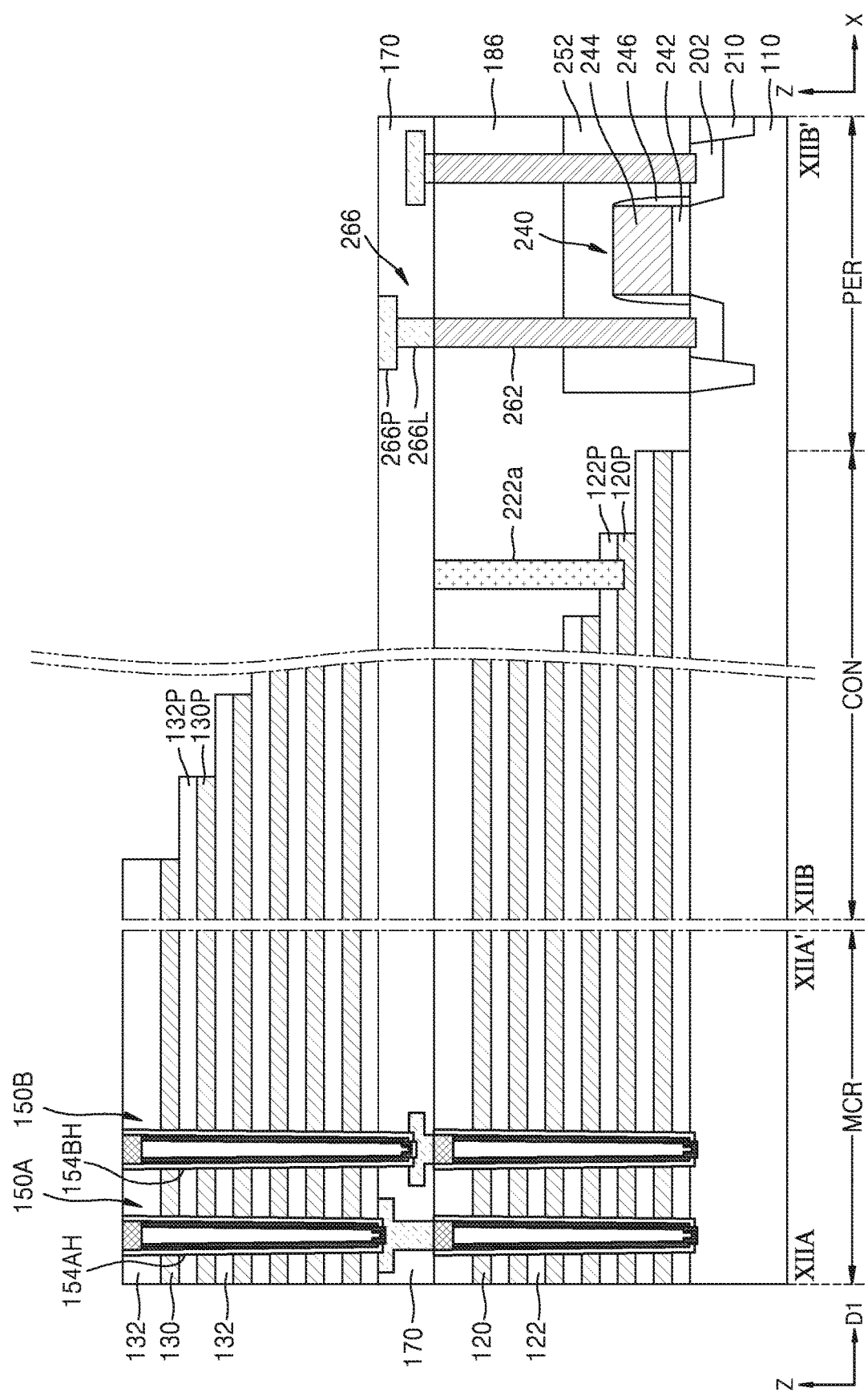

Referring to FIG. 20, the upper pad lines 130P may be formed by sequentially patterning the upper gate electrode stack 130S in the connection region CON. In this process, the upper insulating layer 132 on each of the upper pad lines 130P is also patterned, and thus the upper pad insulating layers 132P covering the top surfaces of the upper pad lines 130P may be formed.

Next, the first upper channel hole 154AH and a second upper channel hole 154BH may be formed in the upper gate electrode stack 130S.

In example embodiments, the substrate 110 may be bent or warped or a mask pattern (not shown) may be misaligned during the process for forming the first upper channel hole 154AH and the second upper channel hole 154BH. In this case, the upper channel holes 150AH4 and 150BH4 may be spaced apart from (e.g., isolated from direct contact with) the center lines CLAL and CLBL of the first and second lower channel structures 152A and 152B, for example, in the third horizontal direction (direction D1). In this case, the semiconductor device 200A described above with reference to FIG. 13 may be formed.

According to an example process, during a process for forming the first upper channel hole 154AH and the second upper channel hole 154BH2, when the second upper channel hole 154BH2 is etched to a width greater than that of the second upper connection 156BU2, the first interlayer insulating film 170 outside the second upper connection 156BU2 is also removed, and thus the second upper channel hole 154BH2 may be etch-stopped by the second pad 156BP2. In this case, the semiconductor device 100B described above with reference to FIG. 9 may be formed.

Next, the first upper channel structure 154A and the second upper channel structure 154B may be formed on the inner walls of the first upper channel hole 154AH and the second upper channel hole 154BH, respectively.

Figure 21:
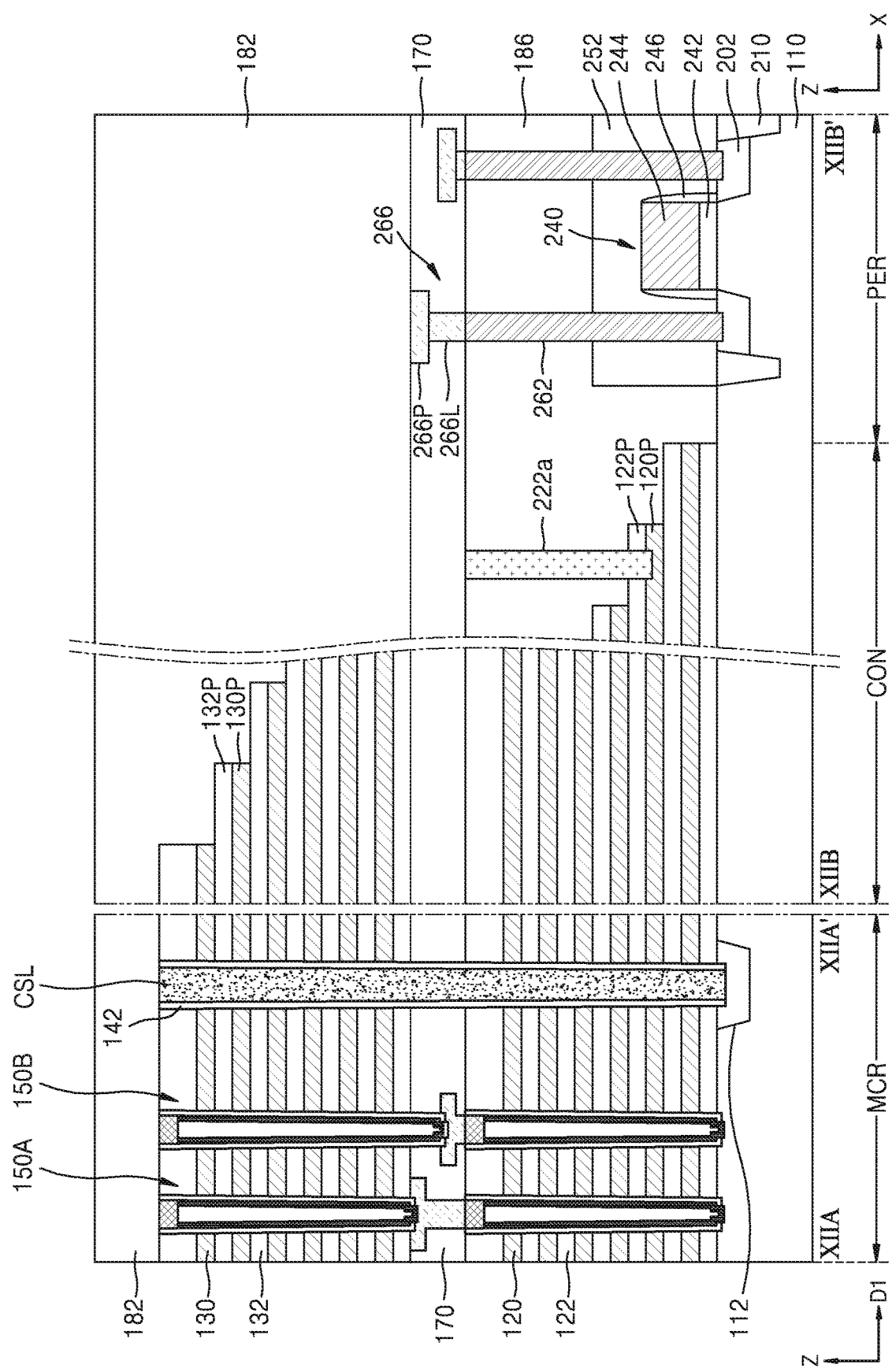

Referring to FIG. 21, the top surface of the substrate 110 may be exposed by forming an opening (not shown) in the word line cut region WLC (refer to FIG. 11) by removing portions of the upper gate electrodes 130 and the lower gate electrodes 120 in the memory cell region MCR. By implanting an impurity into the substrate 110 through the WLC, the common source region 112 may be formed in a portion of the substrate 110 below the word line cut region WLC.

Next, the common source line CSL electrically connected to the common source region 112 may be formed in the word line cut region WLC.

In other embodiments, when the lower gate electrode stack 120S and the upper gate electrode stack 130S are formed using a plurality of sacrificial layers instead of the lower gate electrodes 120 and the upper gate electrodes 130 in a process described above with reference to FIGS. 15 and 19, the sacrificial layers may be removed through the opening of the word line cut region WLC before the common source line CSL is formed and the space from which the sacrificial layers are removed may be filled with lower and upper gate electrodes 120 and 130.

Next, the second interlayer insulating film 182 covering the memory cell region MCR, the connection region CON, and the peripheral circuit region PER may be formed.

Figure 22:
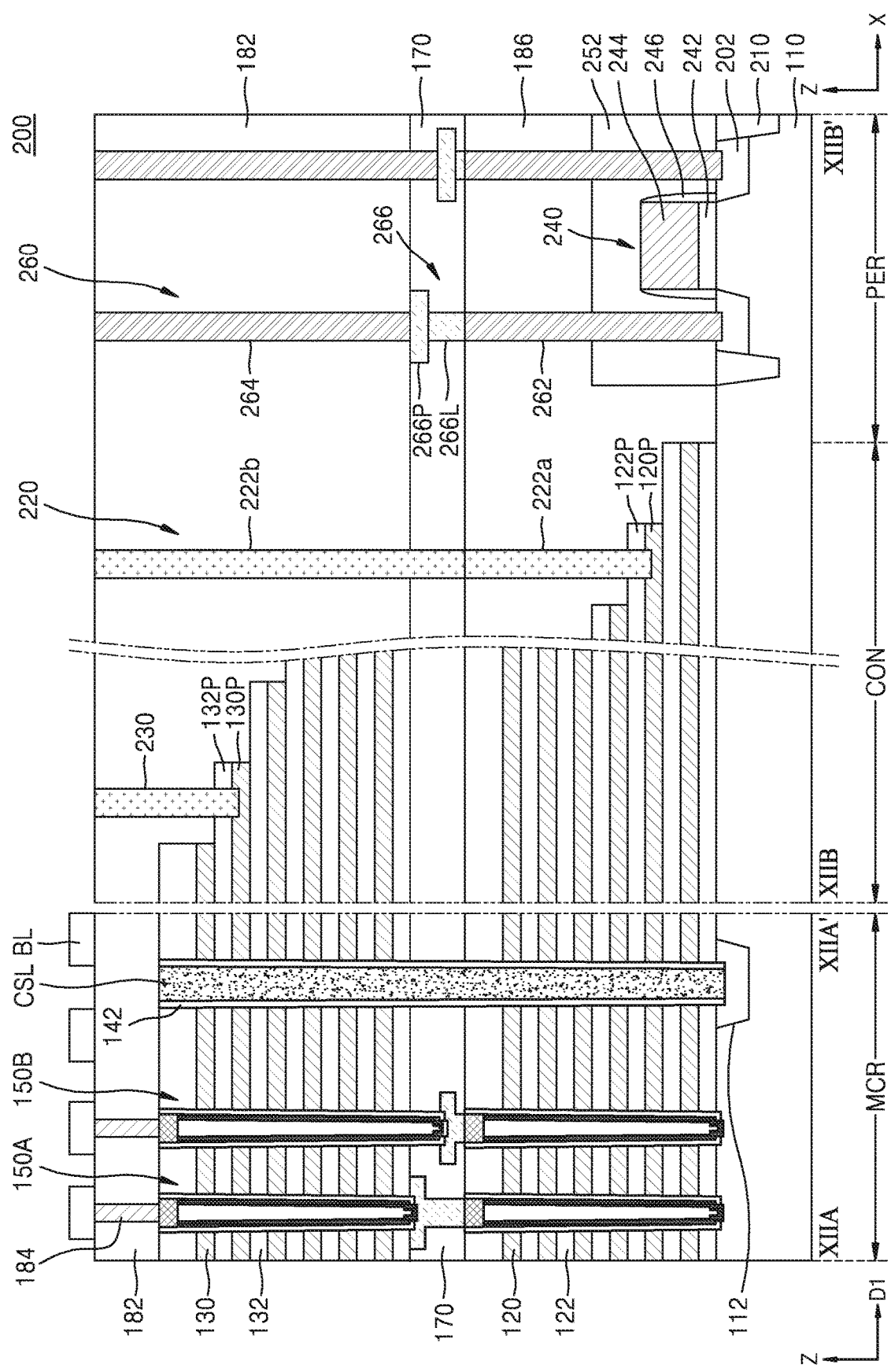

Referring to FIG. 22, the upper cell contact 230 connected to the upper pad line 130P and the second lower cell contact 222b connected to the first lower cell contact 222a may be formed in the connection region CON. Also, a first driving circuit upper contact 264 connected to the driving circuit landing pad 266 may be formed in the peripheral circuit region PER.

As described above, example embodiments have been disclosed in the drawings and specification. While example embodiments have been described herein with reference to specific terms, it should be understood that they have been used only for the purpose of describing the technical idea of the present disclosure and not for limiting the scope of the present disclosure as defined in the claims. Therefore, one of ordinary skill in the art will appreciate that various modifications and equivalent embodiments are possible without departing from the scope of the inventive concepts. Accordingly, the true scope of protection of the present disclosure should be determined by the technical idea of the appended claims.

What is claimed is:

1. A semiconductor device, comprising:
a plurality of lower gate electrodes on a substrate in a first direction substantially perpendicular to a top surface of the substrate;
a plurality of upper gate electrodes on the plurality of lower gate electrodes in the first direction, the plurality of upper gate electrodes spaced apart from one another in the first direction; and
a plurality of channel structures, each channel structure of the plurality of channel structures extending through both the plurality of lower gate electrodes and the plurality of upper gate electrodes in the first direction, each channel structure of the plurality of channel structures including
a lower channel structure penetrating through the plurality of lower gate electrodes,
an upper channel structure penetrating through the plurality of upper gate electrodes, and
a landing pad interconnecting the lower channel structure to the upper channel structure,
wherein a first channel structure of the plurality of channel structures includes a first landing pad having a horizontal width substantially greater than a horizontal width of a first lower channel structure of the first channel structure at a first vertical level,
wherein a second channel structure of the plurality of channel structures that is closest to the first channel structure of a remainder of the plurality of channel structures includes a second landing pad having a horizontal width substantially greater than a horizontal width of a second lower channel structure of the second channel structure at a second vertical level,
wherein the first landing pad includes a first lower connection on the first lower channel structure, and a first pad on the first lower connection at the first vertical level, a horizontal width of the first pad being substantially greater than a horizontal width of the first lower connection,
wherein the second landing pad includes a second lower connection on the second lower channel structure, and a second pad on the second lower connection at the second vertical level, a horizontal width of the second pad being substantially greater than a horizontal width of the second lower connection,
wherein the first and second channel structures have a same length in the first direction, the first and second lower channel structures have a same length in the first direction, and the first and second lower connections have different lengths in the first direction, such that the second vertical level is lower than the first vertical level.

2. The semiconductor device of claim 1, wherein
the horizontal width of the first pad is substantially greater than the horizontal width of the first lower channel structure, and
the horizontal width of the second pad is substantially greater than the horizontal width of the second lower channel structure.

3. The semiconductor device of claim 1, wherein a bottom surface of the first pad is located at a level substantially higher than a level of a top surface of the second pad, and the first pad and the second pad are spaced apart from each other in the first direction.

4. The semiconductor device of claim 1, wherein
a bottom surface of a first upper channel structure of the first channel structure contacts the first pad,
a bottom surface of a second upper channel structure of the second channel structure contacts the second pad, and
the bottom surface of the second upper channel structure of the second channel structure is located at a level substantially lower than a level of the bottom surface of the first upper channel structure of the first channel structure.

5. The semiconductor device of claim 1, wherein
the second landing pad further includes an upper connection that is on the second pad and has a horizontal width that is substantially less than the horizontal width of the second pad.

6. The semiconductor device of claim 5, wherein a bottom surface of a second upper channel structure of the second channel structure contacts the upper connection.

7. The semiconductor device of claim 6, wherein a lower portion of the second upper channel structure of the second channel structure surrounds one or more outer surfaces of the upper connection.

8. The semiconductor device of claim 1, wherein
the substrate includes a memory cell region and a peripheral circuit region on at least one side of the memory cell region,
the plurality of lower gate electrodes, the plurality of upper gate electrodes, and the plurality of channel structures are on the memory cell region,
a peripheral circuit element and a peripheral circuit contact structure coupled to the peripheral circuit element are on the peripheral circuit region,
the peripheral circuit contact structure includes a lower contact coupled to the peripheral circuit element, a third landing pad on the lower contact, and an upper contact on the third landing pad, and
a horizontal width of the third landing pad is substantially greater than a horizontal width of the lower contact.

9. The semiconductor device of claim 1, wherein
a first upper channel structure of the first channel structure extends in the first direction,
a first center axis of the first upper channel structure offset from a second center axis of the first lower channel structure of the first channel structure in a second direction that is substantially parallel to the top surface of the substrate, and
substantially an entire bottom surface of the first upper channel structure contacts a top surface of the first pad.

10. The semiconductor device of claim 1, wherein
the substrate includes a peripheral circuit region and a memory cell region, the memory cell region at a level higher than that of the peripheral circuit region from the top surface of the substrate,
the plurality of lower gate electrodes, the plurality of upper gate electrodes, and the plurality of channel structures are on the memory cell region,
a peripheral circuit element is on the peripheral circuit region,
a peripheral circuit contact structure is coupled to the peripheral circuit element,
the peripheral circuit contact structure includes a lower contact coupled to the peripheral circuit element, a fourth landing pad on the lower contact, and an upper contact on the fourth landing pad, and
a horizontal width of the fourth landing pad is substantially greater than a horizontal width of the lower contact.

11. A semiconductor device, comprising:
a plurality of lower gate electrodes on a substrate in a first direction substantially perpendicular to a top surface of the substrate;
a plurality of upper gate electrodes on the plurality of lower gate electrodes in the first direction, the plurality of upper gate electrodes spaced apart from one another in the first direction; and
a plurality of channel structures, each channel structure of the plurality of channel structures extending through both the plurality of lower gate electrodes and the plurality of upper gate electrodes in the first direction, each channel structure of the plurality of channel structures including
  a lower channel structure penetrating through the plurality of lower gate electrodes,
  an upper channel structure penetrating through the plurality of upper gate electrodes, and
  a landing pad interconnecting the lower channel structure to the upper channel structure,
wherein a first channel structure of the plurality of channel structures includes a first landing pad having a largest horizontal width of the first landing pad at a first vertical level,
wherein a second channel structure of the plurality of channel structures that is closest to the first channel structure includes a second landing pad having a largest horizontal width of the second landing pad at a second vertical level,
wherein the first landing pad includes a first lower connection on a first lower channel structure of the first channel structure, and a first pad on the first lower connection at the first vertical level, a horizontal width of the first pad being substantially greater than a horizontal width of the first lower connection and being the largest horizontal width of the first landing pad,
wherein the second landing pad includes a second lower connection on a second lower channel structure of the second channel structure, and a second pad on the second lower connection at the second vertical level, a horizontal width of the second pad being substantially greater than a horizontal width of the second lower connection and being the largest horizontal width of the second landing pad,
wherein the first and second channel structures have a same length in the first direction, the first and second lower channel structures have a same length in the first direction, and the first and second lower connections have different lengths in the first direction, such that the second vertical level is substantially lower than the first vertical level.

12. The semiconductor device of claim 11, wherein
the largest horizontal width of the first landing pad is substantially greater than a horizontal width of a first lower channel structure of the first channel structure, and
the largest horizontal width of the second landing pad is substantially greater than a horizontal width of a second lower channel structure of the second channel structure.

13. The semiconductor device of claim 11, wherein a bottom surface of the first pad is located at a level substantially higher than a level of a top surface of the second pad, and the first pad and the second pad are spaced apart from each other in the first direction.

14. A semiconductor device, comprising:
a plurality of lower gate electrodes on a substrate in a first direction substantially perpendicular to a top surface of the substrate;
a plurality of upper gate electrodes on the plurality of lower gate electrodes in the first direction, the plurality of upper gate electrodes spaced apart from one another in the first direction;
a first channel structure that extends in the first direction and includes a first lower channel structure penetrating through the lower gate electrodes, a first upper channel structure penetrating through the upper gate electrodes, and a first landing pad between the first lower channel structure and the first upper channel structure; and
a second channel structure that extends in the first direction and is spaced apart from the first channel structure in a second direction parallel to the top surface of the substrate and includes a second lower channel structure penetrating through the lower gate electrodes, a second upper channel structure penetrating through the upper gate electrodes, and a second landing pad between the second lower channel structure and the second upper channel structure,
wherein the first and second channel structures have a same length in the first direction, the first and second upper channel structures have different lengths in the first direction, and the first and second lower channel structures have a same length in the first direction, such that a bottom surface of the first upper channel structure contacts the first landing pad at a first vertical level and a bottom surface of the second upper channel structure contacts the second landing pad at a second vertical level substantially lower than the first vertical level.

15. The semiconductor device of claim 14, wherein
the first landing pad includes
  a first lower connection coupled to the first lower channel structure; and
  a first pad contacting the bottom surface of the first upper channel structure on the first lower connection, and
the second landing pad further includes
  a second lower connection coupled to the second lower channel structure; and
  a second pad contacting the bottom surface of the second upper channel structure on the second lower connection, and
a horizontal width of the first pad is substantially greater than a horizontal width of the first lower channel structure and a horizontal width of the second pad is substantially greater than a horizontal width of the second lower channel structure.

16. The semiconductor device of claim 15, wherein
the first upper channel structure vertically overlaps with the first pad, and
the first upper channel structure vertically overlaps with at least a portion of the first lower channel structure.

17. The semiconductor device of claim 14, wherein the first upper channel structure extends in the first direction and a first center axis of the first upper channel structure is offset from a second center axis of the first lower channel structure in the second direction.

18. The semiconductor device of claim 14, further comprising:
an interlayer insulating film between the plurality of lower gate electrodes and the plurality of upper gate electrodes, wherein a side surface of the first landing pad and a side surface of the second landing pad are surrounded by the interlayer insulating film.

* * * * *